United States Patent
Sugahara et al.

(10) Patent No.: US 10,542,623 B2
(45) Date of Patent: Jan. 21, 2020

(54) POROUS POLYIMIDE SHAPED ARTICLE

(71) Applicant: FUJI XEROX CO., LTD., Tokyo (JP)

(72) Inventors: Hajime Sugahara, Kanagawa (JP);
Hidekazu Hirose, Kanagawa (JP);
Katsumi Nukada, Kanagawa (JP);
Tomoya Sasaki, Kanagawa (JP);
Kosaku Yoshimura, Kanagawa (JP);
Akira Imai, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 16/167,547

(22) Filed: Oct. 23, 2018

(65) Prior Publication Data
US 2019/0239350 A1    Aug. 1, 2019

(30) Foreign Application Priority Data

Jan. 31, 2018  (JP) ................................ 2018-014907

(51) Int. Cl.
*H05K 1/03* (2006.01)

(52) U.S. Cl.
CPC ... *H05K 1/0373* (2013.01); *H05K 2201/0116* (2013.01); *H05K 2201/0154* (2013.01); *H05K 2201/0191* (2013.01)

(58) Field of Classification Search
CPC ......... H05K 1/0373; H05K 2201/0116; H05K 2201/0154; H05K 2201/0191; H01L 21/02203; H01L 21/7682
See application file for complete search history.

(56) References Cited

U.S. PATENT DOCUMENTS

| 7,262,487 | B2 * | 8/2007 | Farnworth | ........ | H01L 21/02126 257/632 |
| 2003/0129379 | A1 * | 7/2003 | Yao | ........................ | B29C 41/12 428/308.4 |
| 2003/0217517 | A1 * | 11/2003 | Allison | .................... | B24B 37/24 51/298 |
| 2006/0116000 | A1 * | 6/2006 | Yamamoto | ........ | H01L 21/02126 438/795 |
| 2014/0220330 | A1 * | 8/2014 | Park | ..................... | H05K 1/0346 428/220 |

FOREIGN PATENT DOCUMENTS

| JP | 2014231533 | 12/2014 |
| JP | 2017148986 | 8/2017 |
| WO | 2012105678 | 8/2012 |

OTHER PUBLICATIONS

Tokyo Ohka Kogyo Co, Ltd., English Translation JP2017-148986 (Year: 2017).*

* cited by examiner

*Primary Examiner* — Steven T Sawyer
(74) *Attorney, Agent, or Firm* — JCIPRNET

(57) ABSTRACT

A porous polyimide shaped article has a thickness in a range from 550 μm to 3,000 μm and has a relative dielectric constant of 1.8 or less and a dielectric loss tangent of 0.01 or less at 1 MHz. The porous polyimide shaped article satisfies the following formula:

$$1.2 \leq A \leq 1.6$$

wherein A represents a square root of a ratio of a pore size $D_{84}$ where a cumulative percentage by number of pores from smaller sizes is 84% to a pore size $D_{16}$ where the cumulative percentage by number of the pores from smaller sizes is 16% $((D_{84}/D_{16})^{1/2})$ in a pore size distribution measured by mercury intrusion porosimetry.

9 Claims, 3 Drawing Sheets

POROUS POLYIMIDE SHAPED ARTICLE

CROSS-REFERENCE TO RELATED APPLICATIONS

This application is based on and claims priority under 35 USC 119 from Japanese Patent Application No. 2018-014907 filed Jan. 31, 2018.

BACKGROUND

(i) Technical Field

The present disclosure relates to porous polyimide shaped articles.

(ii) Related Art

Polyimide resins have superior properties such as high mechanical strength, chemical stability, and heat resistance. Because of these properties, porous polyimide shaped articles have attracted attention.

For example, Japanese Laid Open Patent Application Publication No. 2017-148986 discloses a laminate for a wiring board. This laminate includes a porous film and a conductive film laminated on at least one side of the porous film. The porous film is formed from a resin containing at least one of a polyamic acid, a polyimide, a polyamide-imide, a polyamide, polyvinylidene fluoride, a polybenzoxazole resin, a polybenzimidazole resin, a polysulfone, a polyarylsulfone, and a polyethersulfone. The porous film contains a plurality of voids having the shape of a sphere or connected spheres.

Japanese Laid Open Patent Application Publication No. 2014-231533 discloses a porous resin shaped article containing bubbles with an average bubble size of 5 μm or less and having a porosity of 40% or more and a relative dielectric constant of 2.00 or less at a frequency of 1 GHz. It is also disclosed that this porous resin shaped article is formed of a polyimide resin or polyetherimide resin.

Porous polyimide shaped articles having a thickness of 500 μm or less have low tensile strength. Such porous polyimide shaped articles may also exhibit variation in pore size distribution, which may result in in-plane variation in relative dielectric constant.

SUMMARY

Aspects of non-limiting embodiments of the present disclosure relate to a porous polyimide shaped article that has improved tensile strength and exhibits reduced in-plane variation in relative dielectric constant as compared to a porous polyimide shaped article having a thickness of less than 550 μm.

Aspects of certain non-limiting embodiments of the present disclosure overcome the above disadvantages and/or other disadvantages not described above. However, aspects of the non-limiting embodiments are not required to overcome the disadvantages described above, and aspects of the non-limiting embodiments of the present disclosure may not overcome any of the disadvantages described above.

According to an aspect of the present disclosure, there is provided a porous polyimide shaped article having a thickness in a range from 550 μm to 3,000 μm and having a relative dielectric constant of 1.8 or less and a dielectric loss tangent of 0.01 or less at 1 MHz. The porous polyimide shaped article satisfies the following formula:

$$1.2 \leq A \leq 1.6$$

wherein A represents a square root of a ratio of a pore size $D_{84}$ where a cumulative percentage by number of pores from smaller sizes is 84% to a pore size $D_{16}$ where the cumulative percentage by number of the pores from smaller sizes is 16% ($(D_{84}/D_{16})^{1/2}$) in a pore size distribution measured by mercury intrusion porosimetry.

BRIEF DESCRIPTION OF THE DRAWINGS

An exemplary embodiment of the present disclosure will be described in detail based on the following figures, wherein.

DETAILED DESCRIPTION

Figure 1A:
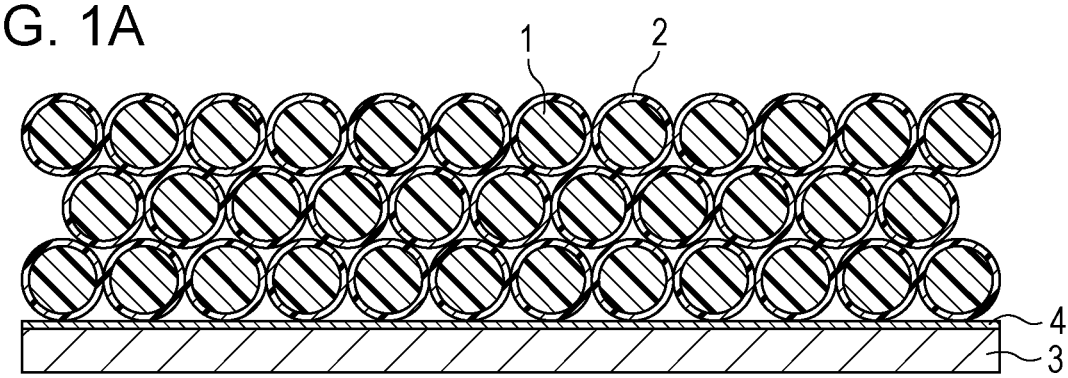
FIGS. 1A to 1D illustrate an example method for manufacturing a porous polyimide shaped article according to the exemplary embodiment.

An exemplary embodiment will hereinafter be described as an example of the present disclosure.
Porous Polyimide Shaped Article A porous polyimide shaped article according to the exemplary embodiment has a thickness in a range from 550 μm to 3,000 μm and has a relative dielectric constant of 1.8 or less and a dielectric loss tangent of 0.01 or less at 1 MHz. The porous polyimide shaped article satisfies the following formula:

$$1.2 \leq A \leq 1.6$$

wherein A represents the square root of the ratio of a pore size $D_{84}$ where the cumulative percentage by number of the pores from smaller sizes is 84% to a pore size $D_{16}$ where the cumulative percentage by number of the pores from smaller sizes is 16% ($(D_{84}/D_{16})^{1/2}$) (which may hereinafter be referred to as "pore size distribution index") in a pore size distribution measured by mercury intrusion porosimetry.

An example method for manufacturing a porous polyimide shaped article having the configuration described above includes a first step of forming a coating containing a polyimide precursor solution containing a polyimide precursor and an organic amine compound dissolved in an aqueous solvent and resin particles insoluble in the polyimide precursor solution and then drying the coating to form a film containing the polyimide precursor and the resin particles; and a second step of heating the film to imidize the polyimide precursor, thereby forming a polyimide shaped article. The second step includes a treatment for removing the resin particles. The porous polyimide shaped article according to the exemplary embodiment is obtained through these manufacturing steps.

In the method of manufacture described above, the treatment for removing the resin particles to form voids may remove the resin particles such that the porous polyimide shaped article has pore sizes within a certain range. This may result in reduced variation in pore size distribution and thus reduced in-plane variation in relative dielectric constant. The reduced variation in pore size distribution may also result in improved tensile strength.

Properties of Porous Polyimide Shaped Article
Thickness

The porous polyimide shaped article according to the exemplary embodiment has a thickness of from 550 μm to 3,000 μm. To improve the tensile strength and further reduce the in-plane variation in relative dielectric constant, the lower limit of the thickness may be 600 μm or more, 800 μm or more, or 1,000 μm or more. The upper limit of the thickness may be 2,800 μm or less, or 2,600 μm or less.

The thickness of the porous polyimide shaped article is measured in an environment at 23° C.±1° C. with a measuring instrument (MINIAX PH-13 high-precision digital measuring instrument and DH-150 display unit, both manufactured by Tokyo Seimitsu Co., Ltd.).

Pore Size Distribution Index

The pore size distribution index is calculated as the square root of the ratio of a pore size $D_{84}$ where the cumulative percentage by number of the pores from smaller sizes is 84% to a pore size $D_{16}$ where the cumulative percentage by number of the pores from smaller sizes is 16% $((D_{84}/D_{16})^{1/2})$ in a pore size distribution measured by mercury intrusion porosimetry. The porous polyimide shaped article according to the exemplary embodiment has a pore size distribution index of from 1.2 to 1.6. To improve the tensile strength and further reduce the in-plane variation in relative dielectric constant, the pore size distribution index may be from 1.25 to 1.55, preferably from 1.3 to 1.5.

The pore size distribution is measured as follows. The porous polyimide shaped article is first cut into two pieces with a size of 30 mm wide×60 mm long. The two cut pieces of the porous polyimide shaped article are then stacked to form a test specimen for measurement. This test specimen is used to measure the pore size distribution by mercury intrusion porosimetry in accordance with JIS R 1655(2003).

The average pore size $D_{50}$ (the pore size where the cumulative percentage by number of the pores from smaller sizes is 50%) measured by the method described above may be from 0.1 μm to 0.9 μm (preferably from 0.15 μm to 0.85 μm).

Relative Dielectric Constant and Dielectric Loss Tangent at 1 MHz

The porous polyimide shaped article according to the exemplary embodiment has a relative dielectric constant of 1.8 or less at 1 MHz. The relative dielectric constant may be 1.6 or less, preferably 1.5 or less. Although not specified, the lower limit of the relative dielectric constant is more than that of air, i.e., 1.

The porous polyimide shaped article according to the exemplary embodiment has a dielectric loss tangent of 0.01 or less at 1 MHz. The dielectric loss tangent may be 0.007 or less, preferably 0.005 or less. The lower limit of the dielectric loss tangent may be, for example, but not limited to, 0.002 or more.

To determine the relative dielectric constant, the capacitance and the loss are measured by the parallel-plate method with an LCR meter at a frequency of 1 GHz. The thickness is also measured with a KBM (trademark) microthickness meter manufactured by Toyo Seiki Seisaku-sho, Ltd. at a room temperature of 23° C.±2° C. These measurements are used to calculate the relative dielectric constant and the dielectric loss tangent.

The measuring instrument is an LCR meter (ZM2372 manufactured by NF Corporation). The test specimen used for measurement is a porous polyimide shaped article held between opposing parallel plates (8 mm thick×8 mm long).

Tensile Strength

To provide superior tensile strength, the porous polyimide shaped article according to the exemplary embodiment may have a tensile strength of 65 MPa or more, preferably 70 MPa or more. The upper limit of the tensile strength may be, for example, but not limited to, 300 MPa or less.

The tensile strength is measured by a tensile test in accordance with ASTM D1708. The tensile test is performed on a test specimen (gauge section: 60 mm long and 5 mm wide; grip section: 40 mm wide; total length of gauge and grip sections: 100 mm) at a tensile speed of 20 mm/min. The measuring instrument is an AUTOGRAPH AG-A (trademark) tensile tester manufactured by Shimadzu Corporation.

Other Properties

The voids may be spherical in shape. As used herein, "spherical" for voids encompasses both spherical and substantially spherical (nearly spherical) shapes. Specifically, "spherical" means that the percentage of voids having a ratio of the major axis to the minor axis (major axis/minor axis) of from 1 to 1.5 is more than 80%. The preferred percentage of voids having a ratio of the major axis to the minor axis (major axis/minor axis) of from 1 to 1.5 is 90% or more. That is, the porous polyimide shaped article according to the exemplary embodiment may contain spherical voids, and the percentage of voids having a ratio of the major axis to the minor axis (major axis/minor axis) of more than 1.5 may be 20% or less. The preferred percentage of voids having a ratio of the major axis to the minor axis (major axis/minor axis) of more than 1.5 is less than 10%. As the ratio of the major axis to the minor axis approaches 1, the voids become closer to a perfect sphere.

The porosity may be, but not limited to, 30% or more. The preferred porosity is 40% or more, more preferably 50% or more. The upper limit of the porosity may be, but not limited to, 90% or less.

The voids may be joined and connected to each other. The void size of the portions of the voids joined to each other may be, for example, from 1/100 to 1/2, preferably from 1/50 to 1/3, more preferably from 1/20 to 1/4, of the maximum size of the voids. Specifically, the average void size of the portions of the voids joined and connected to each other may be from 5 nm to 1,500 nm.

The average void size may be, but not limited to, from 0.1 μm to 0.5 μm, preferably from 0.25 μm to 0.48 μm, more preferably from 0.25 μm to 0.45 μm.

The voids in the porous polyimide shaped article according to the exemplary embodiment have a ratio of the maximum size to the minimum size (a ratio of the maximum void size to the minimum void size) of from 1 to 2, preferably from 1 to 1.9, more preferably from 1 to 1.8. Of these ranges, a ratio closer to 1 is even more preferred. Within these ranges, the variation in void size may be reduced. The reduced variation in void size may result in improved tensile strength and reduced in-plane variation in relative dielectric constant.

The "ratio of the maximum size to the minimum size" of the voids is a ratio expressed as the maximum size of the voids divided by the minimum size of the voids (i.e., maximum void size/minimum void size).

The maximum, minimum, and average void sizes, the average void size of the portions of the voids connected to each other, and the major and minor axes of the voids are examined and measured under a scanning electron microscope (SEM). Specifically, the porous polyimide shaped article is first cut to prepare a specimen for measurement. This specimen for measurement is used for examination and measurement under a VE SEM manufactured by Keyence Corporation with its accompanying image processing software. One hundred void areas in a cross-section of the specimen for measurement are subjected to examination and measurement to determine the minimum, maximum, and arithmetic average sizes thereof. The size of a noncircular void is determined as the length of the longest portion. The major and minor axes of each void area are also examined and measured under a VE SEM manufactured by Keyence Corporation with its accompanying image processing software, and the ratio of major axis/minor axis is calculated. The void size measured under a scanning electron microscope is distinguished from the pore size measured by mercury intrusion porosimetry.

The porous polyimide shaped article according to the exemplary embodiment may contain an organic amine compound. The porous polyimide shaped article according to the exemplary embodiment may contain any amount of the organic amine compound. For example, from the viewpoint of void shape control, the amount of the organic amine compound may be 0.001% by mass or more based on the total mass of the porous polyimide shaped article. In addition, if the amount of the organic amine compound falls within this range, the tensile strength of the porous polyimide shaped article may be further improved. From the same viewpoint, it is preferred that the lower limit of the amount of the organic amine compound be 0.003% by mass or more, more preferably 0.005% by mass or more. There may be any upper limit to the amount of the organic amine compound. For example, the upper limit of the amount of the organic amine compound is preferably 1.0% by mass or less, more preferably 0.9% by mass or less.

The amount of the organic amine compound in the porous polyimide shaped article may be controlled by changing, for example, the amount of the organic amine compound used in the first step and the heating temperature in the second step of the process of manufacturing the porous polyimide shaped article described later.

The porous polyimide shaped article according to the exemplary embodiment may contain a resin other than polyimide resin. The porous polyimide shaped article according to the exemplary embodiment may contain any amount of the resin other than polyimide resin. For example, from the viewpoint of void shape control, it is preferred that the amount of the resin other than polyimide resin in the porous polyimide shaped article be from 0.005% by mass to 1% by mass based on the total mass of the porous polyimide shaped article. In addition, if the amount of the resin other than polyimide resin falls within this range, the tensile strength of the porous polyimide shaped article may be further improved. From the same viewpoint, it is more preferred that the amount of the resin other than polyimide resin be from 0.008% by mass to 1% by mass, most preferably from 0.01% by mass to 0.9% by mass.

If the particles used are resin particles, the resin other than polyimide resin need not be separately added; instead, the resin other than polyimide resin may be incorporated into the porous polyimide shaped article as a residual component derived from the resin particles. In this case, the amount of the resin other than polyimide resin in the porous polyimide shaped article may be controlled by changing, for example, the amount of the resin particles used in the first step and the conditions for the treatment for removing the resin particles in the second step of the process of manufacturing the porous polyimide shaped article described later.

The resin other than polyimide resin may be present in any state in the porous polyimide shaped article. For example, the resin other than polyimide resin may be present in at least one of the interior of the porous polyimide shaped article and the surface of the porous polyimide shaped article (including the surface of the voids in the porous polyimide shaped article).

Method for Determining Amounts of Organic Amine Compound and Resin Other than Polyimide Resin The presence and amounts of the organic amine compound and the resin other than polyimide resin in the porous polyimide shaped article may be determined, for example, by analyzing and quantifying the components detected by pyrolysis-gas chromatography-mass spectrometry (GC-MS). The specific measurement procedure is as follows.

The components present in the porous polyimide shaped article are analyzed with a gas chromatograph-mass spectrometer (GCMS QP-2010 manufactured by Shimadzu Corporation) equipped with a fall-type pyrolyzer (PY-2020D manufactured by Frontier Laboratories Ltd.).

To analyze the organic amine compound, 0.40 mg of the porous polyimide shaped article is accurately weighed and is subjected to measurement at a pyrolysis temperature of 400° C.

To analyze the resin component other than polyimide, 0.20 mg of the porous polyimide shaped article is accurately weighed and is subjected to measurement at a pyrolysis temperature of 600° C. To analyze the resin other than polyimide, chromatograms for pyrolysis temperatures of 400° C. and 600° C. are compared. For example, if a larger amount of styrene monomer formed by the depolymerization of polystyrene is detected at a pyrolysis temperature of 600° C. than at a pyrolysis temperature of 400° C., it can be determined to be polymer-derived.

Pyrolyzer: PY-2020D manufactured by Frontier Laboratories Ltd.

Gas chromatograph-mass spectrometer: GCMS QP-2010 manufactured by Shimadzu Corporation Pyrolysis temperature: 400° C. and 600° C.

Gas chromatograph injection temperature: 280° C.

Method for injection: split ratio=1:50

Column: ULTRA ALLOY-5 manufactured by Frontier Laboratories Ltd., 0.25 μm, 0.25 mm ID, 30 m Gas chromatograph temperature program: 40° C.→20° C./min→maintained at 280° C. for 10 min Mass range: EI, m/z=29-600 (amount of resin other than polyimide resin)

Other methods for quantifying the amount of the resin other than polyimide resin in the porous polyimide shaped article include methods in which the polyimide resin is hydrolyzed and then analyzed for the resin component other than the polyimide resin by a technique such as liquid chromatography (HPLC) or nuclear magnetic resonance (NMR).

Applications of Porous Polyimide Shaped Article

Examples of applications of the porous polyimide shaped article according to the exemplary embodiment include separators for batteries such as lithium batteries; separators for electrolytic capacitors; electrolyte membranes for devices such as fuel cells; battery electrode materials; gas or liquid separation membranes; low-dielectric-constant materials; and filters.

In particular, the porous polyimide shaped article according to the exemplary embodiment may be suitable for use in applications such as circuit boards for electronic devices and other products. For example, the porous polyimide shaped article according to the exemplary embodiment may be used as a material for a circuit board having a metal layer containing at least one selected from the group consisting of copper, nickel, aluminum, silver, gold, iron, chromium, and alloys thereof on a porous polyimide shaped article. The metal layer may be provided on the porous polyimide shaped article by known methods, including, for example, methods in which a metal foil is bonded to the porous polyimide shaped article with an adhesive and methods in which a metal material is deposited by a technique such as sputtering, electroplating, or electroless plating.

If the porous polyimide shaped article according to the exemplary embodiment is used to form a circuit board, the circuit board may include a porous polyimide shaped article layer and a metal layer disposed on the porous polyimide shaped article layer. The circuit board may optionally further include an adhesive layer between the porous polyimide shaped article layer and the metal layer. The circuit board may have a single-layer configuration composed of a structure including the porous polyimide shaped article layer and the metal layer disposed on the porous polyimide shaped article layer or may have a multilayer configuration in which such structures are repeatedly stacked on top of each other. The porous polyimide shaped article layer may be composed of a single layer or a plurality of layers. The metal layer may be subjected to a known process such as etching to form circuit wiring.

As used herein, "layer" is a concept encompassing not only parts that are continuously present in a plane, but also parts that are intermittently present and parts that are present in a dispersed manner.

The porous polyimide shaped article according to the exemplary embodiment may also be suitable for applications other than circuit boards for electronic devices and other products, including electromagnetic control members. For example, if the porous polyimide shaped article according to the exemplary embodiment is used as an electromagnetic control member, the porous polyimide shaped article may be directly used. Alternatively, a metal layer as described above may be provided on the porous polyimide shaped article for use as a porous polyimide shaped article for an electromagnetic control member (electromagnetic shielding member or electromagnetic absorbing member).

Method for Manufacturing Porous Polyimide Shaped Article

A method for manufacturing the porous polyimide shaped article according to the exemplary embodiment will hereinafter be described. In the drawings referenced in the following description of the method of manufacture, the same components are denoted by the same reference numerals. In the drawings, reference numeral 1 denotes a resin particle, reference numeral 2 denotes a binder resin, reference numeral 3 denotes a substrate, reference numeral 4 denotes a release layer, reference numeral 5 denotes a polyimide precursor solution, reference numeral 7 denotes a void, reference numeral 61 denotes a film during the process of imidizing a polyimide precursor (polyimide film), and reference numeral 62 denotes a porous polyimide shaped article.

An example method for manufacturing the porous polyimide shaped article according to the exemplary embodiment includes the first and second steps described below.

The first step is a step of forming a coating containing a polyimide precursor solution containing a polyimide precursor and an organic amine compound dissolved in an aqueous solvent and resin particles insoluble in the polyimide precursor solution and then drying the coating to form a film containing the polyimide precursor and the resin particles.

The second step is a step of heating the film to imidize the polyimide precursor, thereby forming a polyimide shaped article. The second step includes a treatment for removing the resin particles.

If the treatment for removing the resin particles involves removing the resin particles with an organic solvent in which the resin particles are soluble, the resin may be removed by heating if the resin is crosslinked and difficult to remove.

As used herein, "resin particles insoluble in the polyimide precursor solution" means resin particles that are substantially insoluble in the polyimide precursor solution at 25° C. and encompasses both resin particles that are insoluble in the polyimide precursor solution and resin particles that are soluble in the polyimide precursor solution in an amount within a range from 3% by mass or less.

The method of manufacture illustrated in FIGS. 1A to 1D (an example method for manufacturing the porous polyimide shaped article according to the exemplary embodiment) will hereinafter be described, although this method need not necessarily be employed.

First Step

In the first step, a polyimide precursor solution containing a polyimide precursor and an organic amine compound dissolved in an aqueous solvent is first prepared.

A coating containing the polyimide precursor solution and resin particles insoluble in the polyimide precursor solution is then formed on a substrate. The coating formed on the substrate is then dried to form a film containing the polyimide precursor and the resin particles.

In the following description, the resin particles are resin particles formed of a resin other than polyimide resin.

Specifically, for example, a coating containing a polyimide precursor solution and resin particles insoluble in the polyimide precursor solution may be formed on a substrate in the first step by the following method.

A resin particle dispersion containing resin particles insoluble in the polyimide precursor solution, an organic solvent in which the resin particles are insoluble, and a binder resin soluble in the organic solvent is first prepared. The resin particle dispersion is then applied to a substrate and is dried to form a resin particle layer. In the resin particle layer formed on the substrate, for example, the adjacent resin particles are present without being dissolved in each other and are bound to each other by the binder resin. There are gaps formed between the resin particles in the resin particle layer (see FIG. 1A).

A polyimide precursor solution containing a polyimide precursor and an organic amine compound dissolved in an aqueous solvent is also prepared in advance.

The gaps between the resin particles in the resin particle layer formed on the substrate are then impregnated with the polyimide precursor solution prepared in advance. By impregnating the gaps between the resin particles in the resin particle layer, the gaps formed between the resin particles in the resin particle layer are filled with the polyimide precursor solution. To promote filling, any gas component may be removed from the gaps under reduced pressure while the resin particles are in contact with the polyimide precursor solution. The coating is then dried to form a film containing the polyimide precursor and the resin particles on the substrate (see FIG. 1B).

The film containing the polyimide precursor and the resin particles may be formed on any substrate. Examples of substrates include resin substrates such as polystyrene and polyethylene terephthalate substrates; glass substrates; ceramic substrates; metal substrates such as iron and stainless steel (SUS) substrates; and composite material substrates composed of these materials. Optionally, for example, the substrate may be subjected to release treatment to form a release layer with a release agent such as a silicone or fluorinated release agent. It may also be effective to treat the surface of the substrate so that it has a roughness similar to the particle size of the resin particles in order to promote exposure of the resin particles in the substrate contact surface.

The resin particle dispersion may be prepared by any method. An example method includes weighing resin particles insoluble in the polyimide precursor solution, an organic solvent in which the resin particles are insoluble, and a binder resin soluble in the organic solvent and mixing then with stirring to obtain a resin particle dispersion. As the resin particles, a dispersion of resin particles dispersed in advance may be prepared, or a commercially available dispersion of resin particles dispersed in advance may be obtained. If a dispersion of resin particles dispersed in advance is prepared, for example, at least one of an ionic surfactant and a nonionic surfactant may be used to enhance the dispersibility of the resin particles.

The binder resin may be dissolved in the organic solvent mentioned above in advance or may be mixed with the resin particles and the organic solvent before being dissolved therein. The solvent may be alcohol-based solvent, which does not dissolve the resin particles, and may contain water.

As used herein, "organic solvent in which the resin particles are insoluble" means an organic solvent in which the resin particles of interest are substantially insoluble at 25° C. and encompasses both organic solvents in which the resin particles of interest are insoluble and organic solvents in which the resin particles of interest are soluble in an amount within a range from 3% by mass or less.

The ratio (mass ratio) of the resin particles to the binder resin in the resin particle dispersion may be as follows: resin particle:binder resin=from 100:0.5 to 100:50, preferably from 100:1 to 100:30, more preferably from 100:2 to 100:20. Within these ranges, the binder resin may partially or completely cover the surface of the individual resin particles in the resin particle layer formed from the resin particle dispersion and may thus readily bond the adjacent resin particles to each other (primarily bonded state, including the so-called pseudo-bonded state). In addition, gaps may readily be formed as an air layer between the resin particles in the resin particle layer.

The resin particles may be any resin particles that are insoluble in the polyimide precursor solution mentioned above. Examples of such resin particles include resin particles obtained by polycondensation of polymerizable monomers, such as polyester resins and urethane resins, and resin particles obtained by radical polymerization of polymerizable monomers, such as vinyl resins and olefin resins. Examples of resin particles obtained by radical polymerization include particles of resins such as (meth)acrylic resins, (meth)acrylate ester resins, styrene-(meth)acrylic resins, polystyrene resins, and polyethylene resins.

The resin particles may be resin particles soluble in solvents in which polyimide resin is insoluble for ease of removal of the resin particles in the second step described later. Specifically, the resin other than polyimide present in the porous polyimide shaped article may be a resin soluble in organic solvents such as tetrahydrofuran, toluene, ethyl acetate, and acetone.

Among these resin particles, those formed from radically polymerizable monomers are preferred from the viewpoint of particle shape control and ease of removal. Preferably, the resin is at least one selected from the group consisting of (meth)acrylic resins, (meth)acrylate ester resins, styrene-(meth)acrylic resins, and polystyrene resins.

As used herein, "soluble in organic solvents" means that the resin particles of interest are soluble in the organic solvent of interest at 25° C. in an amount of 10% by mass or more.

As used herein, "(meth)acrylic" is meant to encompass both "acrylic" and "methacrylic".

For example, if the resin particles are vinyl resin particles, they may be synthesized by any process, including known polymerization processes (radical polymerization processes such as emulsion polymerization, soap-free emulsion polymerization, suspension polymerization, miniemulsion polymerization, and microemulsion polymerization).

For example, if vinyl resin particles are prepared by emulsion polymerization, the vinyl resin particles are prepared by adding a monomer such as a styrene or (meth) acrylic acid to an aqueous solution of a water-soluble polymerization initiator such as potassium persulfate or ammonium persulfate, optionally adding a surfactant such as sodium dodecyl sulfate or diphenyl oxide disulfonate salt, and polymerizing the monomer by heating with stirring.

Examples of monomers for vinyl resins include styrenes having a styrene skeleton, such as styrene, alkyl-substituted styrenes (e.g., α-methylstyrene, 2-methylstyrene, 3-methylstyrene, 4-methylstyrene, 2-ethylstyrene, 3-ethylstyrene, and 4-ethylstyrene), halogen-substituted styrenes (e.g., 2-chlorostyrene, 3-chlorostyrene, and 4-chlorostyrene), and vinylnaphthalene; vinyl-containing esters such as methyl (meth)acrylate, ethyl (meth)acrylate, n-propyl (meth)acrylate, n-butyl (meth)acrylate, lauryl (meth)acrylate, and 2-ethylhexyl (meth)acrylate; vinyl nitriles such as acrylonitrile and methacrylonitrile; vinyl ethers such as vinyl methyl ether and vinyl isobutyl ether; vinyl ketones such as vinyl methyl ketone, vinyl ethyl ketone, and vinyl isopropenyl ketone; acids such as (meth)acrylic acid, maleic acid, cinnamic acid, fumaric acid, and vinylsulfonic acid; and bases such as ethyleneimine, vinylpyridine, and vinylamine.

Other monomers include monofunctional monomers such as vinyl acetate; difunctional monomers such as ethylene glycol dimethacrylate, nonane diacrylate, and decanediol diacrylate; and polyfunctional monomers such as trimethylolpropane triacrylate and trimethylolpropane trimethacrylate.

The vinyl resin may be a resin of one of these monomers or may be a resin that is a copolymer of two or more monomers.

If the monomers used for the resin forming the vinyl resin particles include styrene, the proportion of styrene is preferably from 20% by mass to 100% by mass, more preferably from 40% by mass to 100% by mass, of all monomer components.

The resin particles may have any average particle size. For example, the resin particles may have an average particle size of 2.5 μm or less, preferably 2.0 μm or less, more preferably 1.0 μm or less. The lower limit may be, but not limited to, 0.001 μm or more, preferably 0.005 μm or more, even more preferably 0.01 μm or more.

The average particle size of the resin particles is measured as follows. A particle size distribution obtained by measurement with a laser diffraction particle size distribution analyzer (e.g., LA-700 manufactured by Horiba, Ltd.) is used. The particle size distribution is divided into particle size ranges (channels), and a cumulative volume distribution is plotted against the particle size ranges from smaller particle sizes. The volume average particle size $D_{50v}$ is measured as the particle size where the cumulative percentage is 50% of all particles.

The resin particles of the resin other than polyimide resin that are soluble in solvents in which polyimide resin is insoluble may be, for example, uncrosslinked resin particles having an uncrosslinked structure; however, the resin particles may be crosslinked as long as they possess the solubility described above. Specific examples of such resin particles include those of polymethyl methacrylate (MB series manufactured by Sekisui Plastics Co., Ltd.), (meth) acrylate ester-styrene copolymers (FS series manufactured by Nipponpaint Co., Ltd.), and polystyrene.

The binder resin may be any binder resin that is soluble in the organic solvent and that is insoluble in the polyimide precursor solution. Examples of such binder resins include acetal resins such as polyvinyl butyral resins; polyamide resins such as nylon; polyester resins such as polyethylene terephthalate and polyethylene naphthalate; polyolefin resins such as polyethylene and polypropylene; vinyl resins such as acrylic resins, polyvinyl chloride resins, and polyvinylidene chloride resins; polyurethane resins; polyvinylpyrrolidone; polyethylene glycol; and polyvinyl alcohol. Preferred are polyvinyl acetal resins and aliphatic polyamide resins.

Examples of organic solvents in which the resin particles are insoluble include alcohols such as methanol, ethanol, and ethylene glycol; cellosolves such as ethylene glycol monomethyl ether; hydrocarbons such as hexane; ketones such as acetone; aromatics such as toluene; esters such as ethyl acetate; and nitriles such as acetonitrile.

Among these organic solvents in which the resin particles are insoluble, alcohols and cellosolves are preferred to maintain the shape of the resin particles. The binder resin may be a resin soluble in alcohols and cellosolves (e.g., polyethylene glycol resins, acetal resins, and polyamide resins).

The resin particle dispersion may be applied to the substrate by any technique, including, for example, various techniques such as spray coating techniques, rotational coating techniques, roller coating techniques, bar coating techniques, slit die coating techniques, and inkjet coating techniques.

The coating formed by applying the resin particle dispersion to the substrate is dried to obtain a resin particle layer. The drying temperature may be a temperature at which the shape of the resin particles is maintained and the resin particles are bound to each other (e.g., 100° C.).

The gaps between the resin particles in the resin particle layer formed as described above are then impregnated with the polyimide precursor solution prepared in advance to form a coating containing the polyimide precursor solution and the resin particles. The coating is dried to form a film containing the polyimide precursor and the resin particles.

Impregnation with the polyimide precursor solution may be performed by any technique, including, for example, techniques in which the substrate having the resin particle layer formed thereon is immersed in the polyimide precursor solution and techniques in which the polyimide precursor solution is applied to the resin particle layer formed on the substrate to impregnate the gaps between the particles in the resin particle layer with the polyimide precursor solution.

Examples of techniques in which the polyimide precursor solution is applied to the resin particle layer formed on the substrate include various techniques such as spray coating techniques, rotational coating techniques, roller coating techniques, bar coating techniques, slit die coating techniques, and inkjet coating techniques. A vacuum impregnation filling technique may also be used to impregnate the gaps between the resin particles in the resin particle layer with the polyimide precursor solution. In the vacuum impregnation filling technique, the polyimide precursor solution is applied to the resin particle layer and is then subjected to reduced pressure to fill the gaps between the resin particles with the polyimide precursor solution. The use of the vacuum impregnation filling technique may allow the gaps between the resin particles to be efficiently impregnated with the polyimide precursor solution.

The coating containing the polyimide precursor solution and the resin particles need not necessarily be formed by the method described above.

Specifically, for example, the following method may be used. A polyimide precursor solution containing a polyimide precursor and an organic amine compound dissolved in an aqueous solvent is first prepared. The polyimide precursor solution is then mixed with resin particles insoluble in the polyimide precursor solution to obtain a polyimide precursor solution in which the resin particles are dispersed (hereinafter also referred to as "resin-particle-dispersed polyimide precursor solution"). The resin-particle-dispersed polyimide precursor solution is then applied to a substrate to form a coating containing the polyimide precursor solution and the resin particles. The resin particles in the coating are distributed with reduced aggregation (see FIG. 3A). This coating is then dried to form a film containing the polyimide precursor and the resin particles on the substrate.

The resin-particle-dispersed polyimide precursor solution described above may be prepared by any method, including, for example, methods in which the polyimide precursor solution is mixed with dry resin particles and methods in which the polyimide precursor solution is mixed with a dispersion of resin particles dispersed in an aqueous solvent in advance. To simplify the process, the polyimide precursor may be synthesized in an aqueous solvent dispersion having the resin particles insoluble in the polyimide precursor solution dispersed in an aqueous solvent in advance.

As the dispersion of the resin particles dispersed in an aqueous solvent in advance, a dispersion of resin particles dispersed in an aqueous solvent in advance may be prepared, or a commercially available dispersion of resin particles dispersed in an aqueous solvent in advance may be obtained. If a dispersion of resin particles dispersed in advance is prepared, for example, at least one of an ionic surfactant and a nonionic surfactant may be used to enhance the dispersibility of the resin particles.

The mass ratio of the resin particles in the polyimide precursor solution described above in which the resin particles are dispersed, with the solid content of the polyimide precursor solution being 100, may be as follows: solid content of polyimide precursor solution:resin particle=from 100:20 to 100:600, preferably from 100:25 to 100:550, more preferably from 100:30 to 100:500.

The resin-particle-dispersed polyimide precursor solution may be applied to the substrate by any technique, including, for example, various techniques such as spray coating techniques, rotational coating techniques, roller coating techniques, bar coating techniques, slit die coating techniques, and inkjet coating techniques.

To increase the open area fraction of the porous polyimide shaped article, the amount of the polyimide precursor solution applied to obtain a coating containing the polyimide precursor solution and the resin particles by the methods described above may be selected such that the resin particles are exposed in the coating surface. For example, if the gaps between the resin particles in the resin particle layer are impregnated with the polyimide precursor solution, impregnation with the polyimide precursor solution may be performed such that the thickness of the polyimide precursor solution is less than that of the resin particle layer.

If the resin-particle-dispersed polyimide precursor solution is applied to the substrate, the amount of the resin particles added may be selected such that the resin particles are exposed in the coating surface.

After the coating containing the polyimide precursor solution and the resin particles is formed by the methods described above, the coating is dried to form a film containing the polyimide precursor and the resin particles. Specifically, the coating containing the polyimide precursor solution and the resin particles is dried to form a film, for example, by a technique such as heat drying, air drying, or vacuum drying. More specifically, the coating is dried to form a film so that the amount of the solvent remaining in the film is 50% or less (preferably 30% or less) based on the solid content of the film. The polyimide precursor in this film is soluble in water.

The amount of the coating formed may be selected such that the resin particles are buried in the coating. In this case, after the coating is obtained in the first step, a treatment for exposing the resin particles may be performed to expose the resin particles during the process of drying the coating to form a film. This treatment for exposing the resin particles may increase the open area fraction of the porous polyimide shaped article.

Specifically, for example, the treatment for exposing the resin particles may be performed by the following method.

Figure 1B:
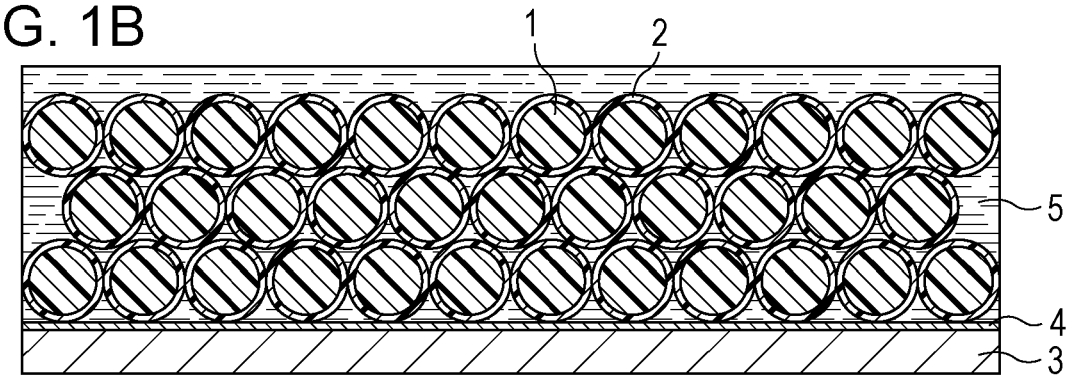
Figure 1C:
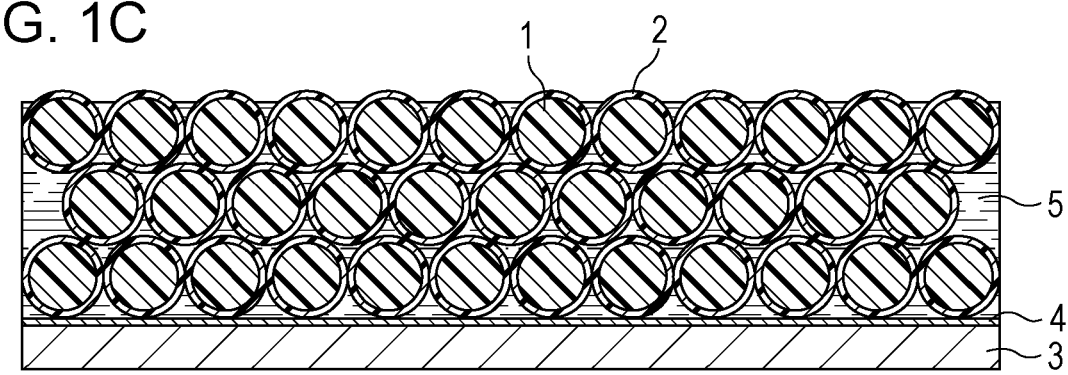
Figure 1D:
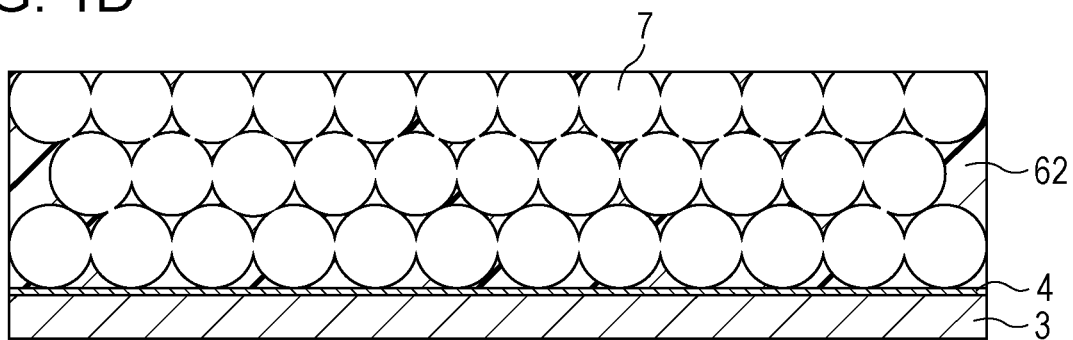

If the gaps between the resin particles forming the resin particle layer are impregnated with the polyimide precursor solution to form a coating such that the resin particle layer is buried therein, the polyimide precursor solution is present in a region above the thickness of the resin particle layer (see FIG. 1B).

As described above, after the coating containing the polyimide precursor solution and the resin particles is obtained, during the process of drying the coating containing the polyimide precursor solution and the resin particles to form a film containing the polyimide precursor and the resin particles, the polyimide precursor in the film is soluble in water. While the film is in this state, the resin particles may be exposed, for example, by a treatment such as wiping treatment or water immersion treatment. Specifically, the polyimide precursor solution present in the region above the thickness of the resin particle layer may be subjected to a treatment for exposing the resin particle layer, for example, by wiping with water, to remove the polyimide precursor solution present in the region above the thickness of the resin particle layer. As a result, the resin particles present in the upper region of the resin particle layer (i.e., the region of the resin particle layer away from the substrate) are exposed in the film surface (see FIG. 1C).

If a resin-particle-dispersed polyimide precursor solution is used to form a film having the resin particles buried therein on the substrate, the resin particles buried in the film may be exposed by a treatment similar to the treatment for exposing the resin particles described above.

Second Step

The second step is a step of heating the film, obtained in the first step, that contains the polyimide precursor and the resin particles to imidize the polyimide precursor, thereby forming a polyimide shaped article. The second step includes a treatment for removing the resin particles. A porous polyimide shaped article is obtained through the treatment for removing the resin particles.

Specifically, the step of forming a polyimide shaped article in the second step includes heating the film, obtained in the first step, that contains the polyimide precursor and the resin particles so that imidization proceeds and further heating the film to form a polyimide shaped article. As imidization proceeds, the degree of imidization increases, and the film becomes less soluble in organic solvents.

In the second step, a treatment for removing the resin particles is performed. The resin particles may be removed during the process of heating the film to imidize the polyimide precursor or may be removed from the polyimide shaped article after completion of imidization (after imidization).

The process of imidizing the polyimide precursor in the exemplary embodiment refers to the process of heating the film, obtained in the first step, that contains the polyimide precursor and the resin particles so that imidization proceeds before imidization is completed to obtain a polyimide shaped article.

Specifically, the resin particles are removed from the film during the process of heating the film, obtained in the first step, that has the resin particles exposed therefrom to imidize the polyimide precursor (the film in this state may be hereinafter referred to as "polyimide film"). Alternatively, the resin particles may be removed from the polyimide shaped article after completion of imidization. As a result, a porous polyimide shaped article having the resin particles removed therefrom is obtained (see FIG. 1D).

For example, from the viewpoint of ease of removal of the resin particles, the treatment for removing the resin particles may be performed when the degree of imidization of the polyimide precursor in the polyimide film is 10% or more during the process of imidizing the polyimide precursor. When the degree of imidization is 10% or more, the film may tend to be poorly soluble in organic solvents, and its shape may tend to be maintained.

The treatment for removing the resin particles may be performed by any method, including, for example, methods in which the resin particles are removed by thermal decomposition, methods in which the resin particles are removed with an organic solvent in which the resin particles are soluble, and methods in which the resin particles are removed by decomposition with a laser or other device.

For example, the resin particles may be removed by thermal decomposition alone, by thermal decomposition in combination with an organic solvent in which the resin particles are soluble, or with an organic solvent in which the resin particles are soluble alone.

For example, the methods in which the resin particles are removed by thermal decomposition may produce a thermal decomposition gas, depending on the type of resin particles. This decomposition gas may cause, for example, a breakage or crack in the porous polyimide shaped article. Accordingly, the methods in which the resin particles are removed with an organic solvent in which the resin particles are soluble may be employed to reduce the likelihood of cracking.

It may also be effective to perform further heating after the resin particles are removed with an organic solvent in which the resin particles are soluble in order to increase the degree of removal.

If the resin particles are removed by a method in which the resin particles are removed with an organic solvent in which the resin particles are soluble, the resin component of the resin particles dissolved in the organic solvent may enter the polyimide film during the process of removing the resin particles. Accordingly, this method may be employed to intentionally incorporate a resin other than polyimide resin into the resulting porous polyimide shaped article. The method in which the resin particles are removed with an organic solvent in which the resin particles are soluble may be employed if a resin other than polyimide resin is incorporated into the porous polyimide shaped article. To incorporate a resin other than polyimide resin, the removal of the resin particles by this method may be performed on the film during the process of imidizing the polyimide precursor (polyimide film). If the resin particles are dissolved in a solvent in which the resin particles are soluble when the film is in the state of a polyimide film, the resin may more easily enter the polyimide film.

Examples of methods in which the resin particles are removed with an organic solvent in which the resin particles are soluble include methods in which the resin particles are dissolved and removed by contact with an organic solvent in which the resin particles are soluble (e.g., by immersion in the solvent or contact with solvent vapor). If the resin particles are immersed in the solvent in this state, the efficiency of dissolving the resin particles may be enhanced.

The organic solvent in which the resin particles are soluble for removing the resin particles may be any organic solvent in which the polyimide film and the polyimide shaped article after completion of imidization are insoluble and the resin particles are soluble. Examples of such organic solvents include ethers such as tetrahydrofuran and 1,4-dioxane; aromatics such as benzene and toluene; ketones such as acetone; and esters such as ethyl acetate.

Preferred among these are ethers such as tetrahydrofuran and 1,4-dioxane and aromatics such as benzene and toluene, more preferably tetrahydrofuran and toluene.

If any aqueous solvent remains during the dissolution of the resin particles, the aqueous solvent may dissolve in the solvent in which the uncrosslinked resin particles are soluble and may cause the polyimide precursor to precipitate. This may result in a state similar to so-called wet phase inversion, thus making it difficult to control the void size. Accordingly, the uncrosslinked resin particles may be removed by dissolution in an organic solvent after the amount of residual aqueous solvent is reduced to 20% by mass or less, preferably 10% by mass or less, based on the mass of the polyimide precursor.

In the second step, the film obtained in the first step may be heated in any manner so that imidization proceeds to obtain a polyimide shaped article. For example, the film may be heated in two or more steps. Specifically, for example, if the film is heated in two steps, the following heating conditions may be employed.

As the heating conditions for the first step, the temperature may be selected such that the shape of the resin particles is maintained. Specifically, for example, the temperature may be from 50° C. to 150° C., preferably from 60° C. to 140° C. The heating time may be from 10 minutes to 60 minutes. The heating time may be shorter for higher heating temperatures.

As the heating conditions for the second step, heating may be performed, for example, at from 150° C. to 400° C. (preferably from 200° C. to 390° C.) for from 20 minutes to 120 minutes. Under heating conditions within these ranges, the imidization reaction may proceed further to form a polyimide shaped article. During the heating reaction, the temperature may be increased stepwise or gradually at a constant rate before the final heating temperature is reached.

The two-step heating process described above need not necessarily be employed as the heating conditions; for example, a one-step heating process may be employed instead. For the one-step heating process, for example, imidization may be completed only under the heating conditions for the second step described above.

If the treatment for exposing the resin particles is not performed in the first step, a treatment for exposing the resin particles may be performed in the second step so that the resin particles are exposed in order to increase the open area fraction. In the second step, the treatment for exposing the resin particles may be performed during the process of imidizing the polyimide precursor or may be performed after imidization and before the treatment for removing the resin particles.

Figure 2A:
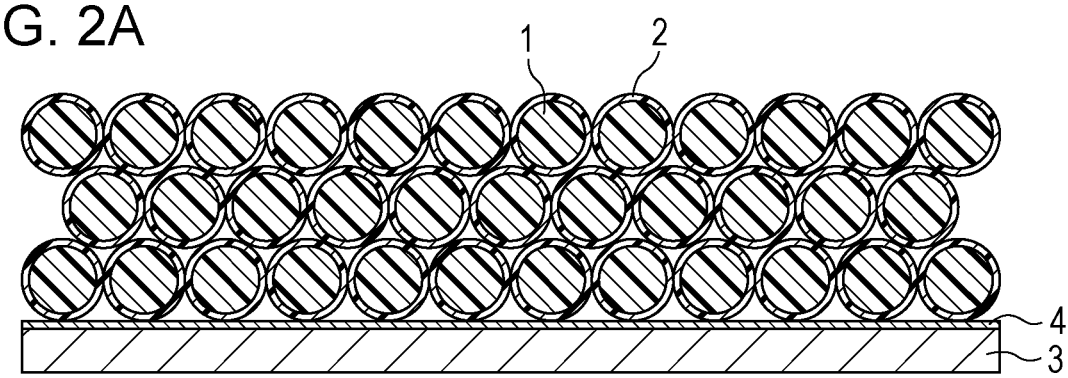
FIGS. 2A to 2D illustrate another example method for manufacturing a porous polyimide shaped article according to the exemplary embodiment.
Figure 2B:
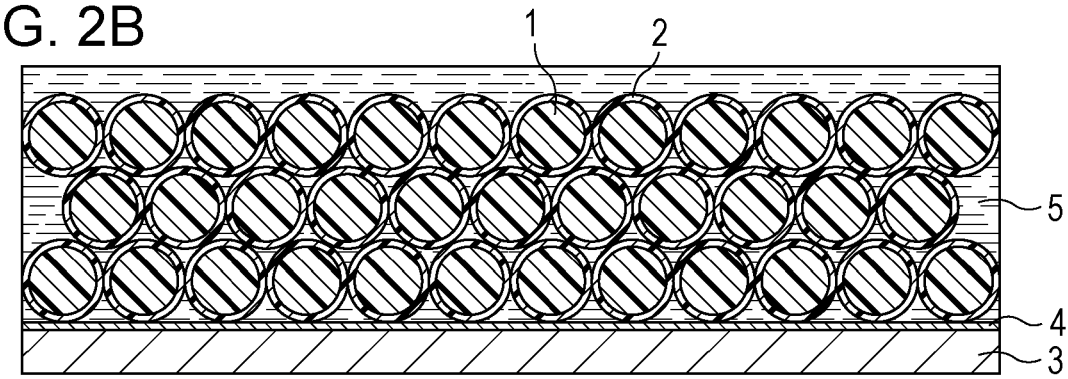

For example, in the first step, a resin particle layer is formed on the substrate (see FIG. 2A), and the gaps between the resin particles in the resin particle layer are impregnated with the polyimide precursor solution to form a coating having the resin particles buried therein (see FIG. 2B). The coating is then dried to form a film containing the polyimide precursor and the resin particles. During this process, a treatment for exposing the resin particles is not performed. The film formed by this method has the resin particle layer buried therein. This film is heated, and before the treatment for removing the resin particles, a treatment for exposing the resin particles is performed during the process of imidizing the polyimide precursor or on the porous polyimide shaped article after completion of imidization (after imidization).

The treatment for exposing the resin particles in the second step may be performed, for example, when the polyimide film is in any of the following states.

If the treatment for exposing the resin particles is performed when the polyimide precursor in the polyimide film has a degree of imidization of less than 10% (i.e., when the polyimide film is soluble in water), the treatment for exposing the resin particles buried in the polyimide film may be, for example, wiping treatment or water immersion treatment.

If the treatment for exposing the resin particles is performed when the polyimide precursor in the polyimide film has a degree of imidization of 10% or more (i.e., when the polyimide film is poorly soluble in organic solvents) or after imidization is completed to form a polyimide shaped article, the resin particles may be exposed, for example, by mechanical cutting with a tool such as sandpaper or by decomposition with a laser or other device.

Figure 2C:
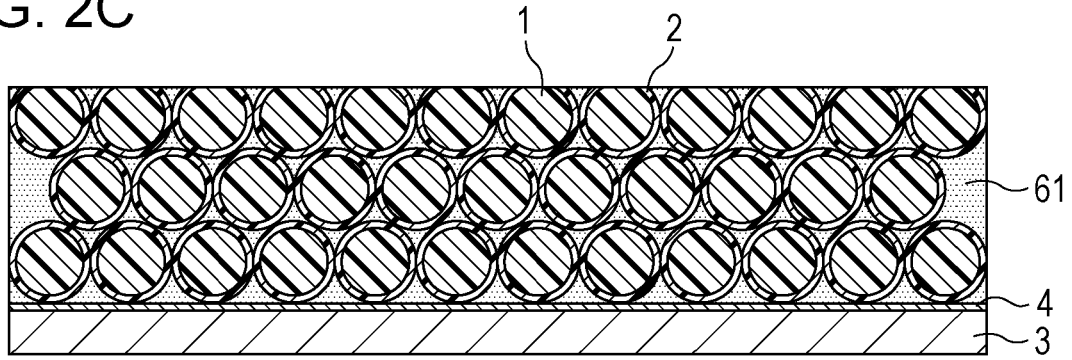

For example, for mechanical cutting, the resin particles present in the upper region of the resin particle layer buried in the polyimide film (i.e., the region of the resin particle layer away from the substrate) are partially cut together with the polyimide film present above the resin particles. The cut resin particles are exposed in the surface of the polyimide film (see FIG. 2C).

Figure 2D:
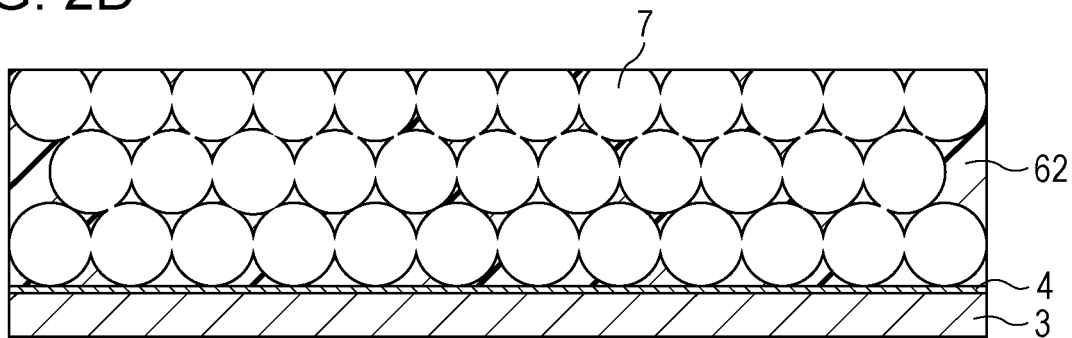

The polyimide film having the resin particles exposed therefrom is then subjected to the treatment for removing the resin particles described above to remove the resin particles. A porous polyimide shaped article having the resin particles removed therefrom is obtained (see FIG. 2D).

Figure 3A:
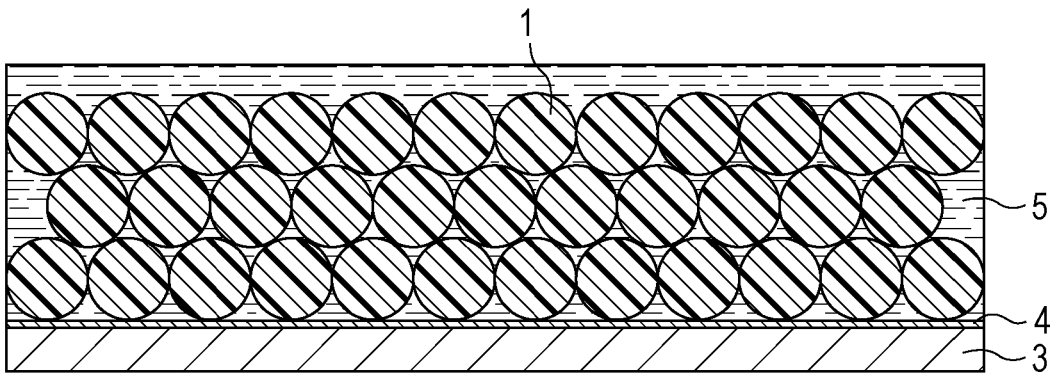
FIGS. 3A to 3C illustrate another example method for manufacturing a porous polyimide shaped article according to the exemplary embodiment.
Figure 3B:
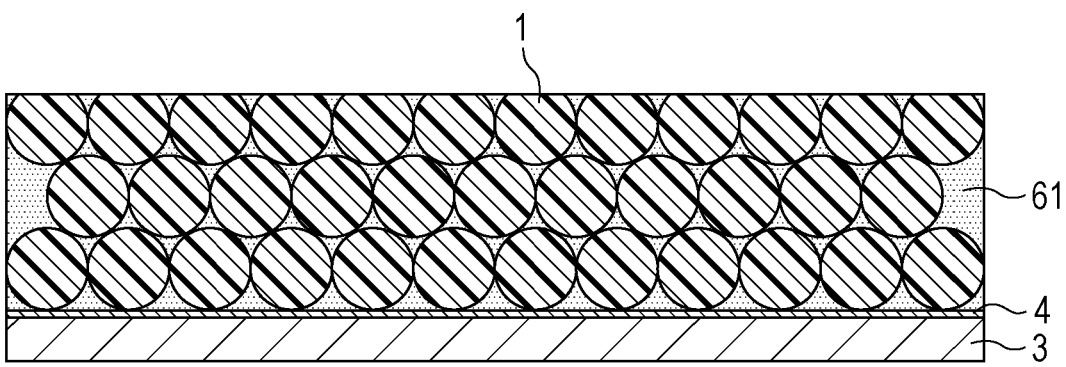

If a resin-particle-dispersed polyimide precursor solution is used to form a film on the substrate, the resin-particle-dispersed polyimide precursor solution is applied to the substrate to form a coating having the resin particles buried therein (see FIG. 3A). If a film containing the polyimide precursor and the resin particles is formed without performing a treatment for exposing the resin particles during the process of drying the coating to form a film, a film having the resin particles buried therein may be formed. For example, if a film having the resin particles buried therein is heated, the film during the imidization process (polyimide film) has the resin particle layer buried therein. To increase the open area fraction, the resin particles may be exposed in the second step by a treatment similar to the treatment for exposing the resin particles described above. The resin particles are cut together with the polyimide film present above the resin particles to expose the resin particles in the surface of the polyimide film (see FIG. 3B).

Figure 3C:
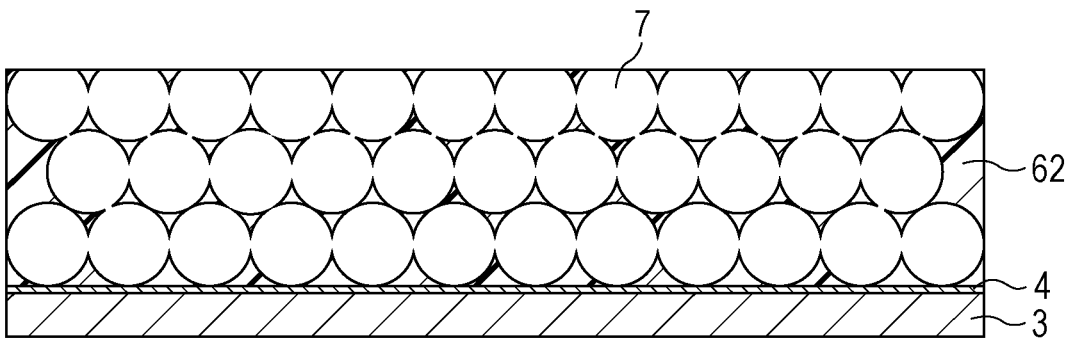

The polyimide film having the resin particles exposed therefrom is then subjected to the treatment for removing the resin particles described above to remove the resin particles. A porous polyimide shaped article having the resin particles removed therefrom is obtained (see FIG. 3C).

In the second step, the substrate used to form the film in the first step may be stripped after a dry film is formed, may be stripped after the polyimide precursor in the polyimide film becomes poorly soluble in organic solvents, or may be stripped after imidization is completed to form a shaped article.

The porous polyimide shaped article according to the exemplary embodiment is obtained through the foregoing steps. The porous polyimide shaped article may be subjected to post-processing depending on the intended use.

The degree of imidization of a polyimide precursor will be described herein.

Examples of partially imidized polyimide precursors include precursors having structures containing repeating units represented by general formulas (I-1), (I-2), (I-3) below.

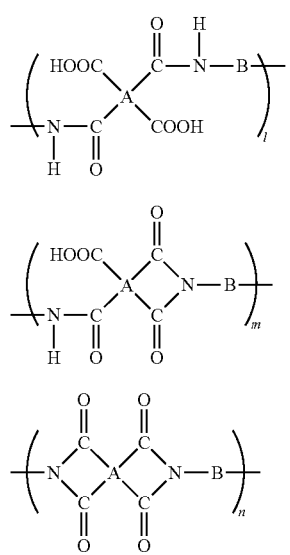

In general formulas (I-1), (I-2), (I-3), A represents a tetravalent organic group, B represents a divalent organic group, l represents an integer of 1 or more, and m and n each independently represent an integer of 0 or more.

A and B are synonymous with those in general formula (I), described later.

The degree of imidization of a polyimide precursor is defined as the proportion of the number of imide-ring-closed bond sites (2n+m) relative to the total number of bond sites (2l+2m+2n) in the polyimide precursor (reaction sites between the tetracarboxylic dianhydride and the diamine compound). That is, the degree of imidization of a polyimide precursor is defined as (2n+m)/(2l+2m+2n).

The degree of imidization of a polyimide precursor (the value of (2n+m)/(2l+2m+2n)) is measured by the following method.

Measurement of Degree of Imidization of Polyimide Precursor

Preparation of Polyimide Precursor Sample (i) The sample polyimide precursor solution is applied at a thickness of from 1 μm to 10 μm to a silicon wafer to prepare a coating sample.

(ii) The coating sample is immersed in tetrahydrofuran (THF) for 20 minutes to replace the solvent in the coating sample with tetrahydrofuran (THF). The solvent used for immersion need not necessarily be THF, but may instead be selected from solvents in which the polyimide precursor is insoluble and that are miscible with the solvent component present in the polyimide precursor solution. Specifically, alcohol solvents such as methanol and ethanol and ether compounds such as dioxane may be used.

(iii) The coating sample is taken from the THF, and any THF deposited on the surface of the coating sample is removed by flushing with $N_2$ gas. The coating sample is dried by treatment under a reduced pressure of 10 mmHg or less at from 5° C. to 25° C. for 12 hours or more to prepare a polyimide precursor sample.

Preparation of 100% Imidized Standard Sample (iv) As in (i) above, the sample polyimide precursor solution is applied to a silicon wafer to prepare a coating sample.

(v) The coating sample is heated at 380° C. for 60 minutes to cause an imidization reaction, thereby preparing a 100% imidized standard sample.

Measurement and Analysis (vi) The infrared absorption spectra of the 100% imidized standard sample and the polyimide precursor sample are measured using a Fourier transform infrared spectrometer (FT-730 manufactured by Horiba, Ltd.). The ratio of an absorption peak derived from imide bonds around 1,780 cm$^{-1}$ (Ab'(1,780 cm$^{-1}$)) to an absorption peak derived from aromatic rings around 1,500 cm$^{-1}$ (Ab'(1,500 cm$^{-1}$)) of the 100% imidized standard sample, I'(100), is determined.

(vii) Similarly, a measurement is performed on the polyimide precursor sample. The ratio of an absorption peak derived from imide bonds around 1,780 cm$^{-1}$ (Ab(1,780 cm$^{-1}$)) to an absorption peak derived from aromatic rings around 1,500 cm$^{-1}$ (Ab(1,500 cm$^{-1}$)), I(x), is determined.

The measured absorption peak ratios I'(100) and I(x) are used to calculate the degree of imidization of the polyimide precursor based on the following equations:

Equation: degree of imidization of polyimide precursor=$I(x)/I'(100)$

Equation: $I'(100)=(Ab'(1,780$ cm$^{-1}))/(Ab'(1,500$ cm$^{-1}))$

Equation: $I(x)=(Ab(1,780$ cm$^{-1}))/(Ab(1,500$ cm$^{-1}))$

This measurement of the degree of imidization of a polyimide precursor is applied to the measurement of the degree of imidization of an aromatic polyimide precursor. To measure the degree of imidization of an aliphatic polyimide precursor, a peak derived from a structure that does not change after the imidization reaction is used as an internal standard peak instead of an absorption peak derived from aromatic rings.

Polyimide Precursor Solution

The polyimide precursor solution may be a polyimide precursor solution containing a polyimide precursor and an organic amine compound dissolved in an aqueous solvent.

The individual components of the polyimide precursor solution for obtaining the porous polyimide shaped article will hereinafter be described. A polyimide precursor solution containing a polyimide precursor and an organic amine compound dissolved in an aqueous solvent will be described by way of example.

Polyimide Precursor

The polyimide precursor is a resin (polyamic acid) containing repeating units represented by general formula (I).

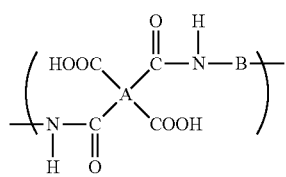

In general formula (I), A represents a tetravalent organic group, and B represents a divalent organic group.

The tetravalent organic group for A in general formula (I) is a residue of a tetracarboxylic dianhydride used as a starting material, with the four carboxyl groups excluded therefrom.

The divalent organic group for B is a residue of a diamine compound used as a starting material, with the two amino groups excluded therefrom.

That is, the polyimide precursor containing repeating units represented by general formula (I) is a polymer of a tetracarboxylic dianhydride and a diamine compound.

The tetracarboxylic dianhydride may be either an aromatic compound or an aliphatic compound, preferably an aromatic compound. That is, the tetravalent organic group for A in general formula (I) is preferably an aromatic organic group.

Examples of aromatic tetracarboxylic dianhydrides include pyromellitic dianhydride, 3,3',4,4'-benzophenonetetracarboxylic dianhydride, 3,3',4,4'-biphenyl sulfone tetracarboxylic dianhydride, 1,4,5,8-naphthalenetetracarboxylic dianhydride, 2,3,6,7-naphthalenetetracarboxylic dianhydride, 3,3',4,4'-biphenyl ether tetracarboxylic dianhydride, 3,3',4,4'-dimethyldiphenylsilanetetracarboxylic dianhydride, 3,3',4,4'-tetraphenylsilanetetracarboxylic dianhydride, 1,2,3,4-furantetracarboxylic dianhydride, 4,4'-bis(3,4-dicarboxyphenoxy)diphenyl sulfide dianhydride, 4,4'-bis(3,4-dicarboxyphenoxy)diphenyl sulfone dianhydride, 4,4'-bis(3,4-dicarboxyphenoxy)diphenylpropane dianhydride, 3,3',4,4'-perfluoroisopropylidenediphthalic dianhydride, 3,3',4,4'-biphenyltetracarboxylic dianhydride, 2,3,3',4'-biphenyltetracarboxylic dianhydride, bis(phthalic acid)phenylphosphine oxide dianhydride, p-phenylene-bis(triphenylphthalic acid) dianhydride, m-phenylene-bis(triphenylphthalic acid) dianhydride, bis(triphenylphthalic acid)-4,4'-diphenyl ether dianhydride, and bis(triphenylphthalic acid)-4,4'-diphenylmethane dianhydride.

Examples of aliphatic tetracarboxylic dianhydrides include aliphatic and alicyclic tetracarboxylic dianhydrides such as butanetetracarboxylic dianhydride, 1,2,3,4-cyclobutanetetracarboxylic dianhydride, 1,3-dimethyl-1,2,3,4-cyclobutanetetracarboxylic dianhydride, 1,2,3,4-cyclopentanetetracarboxylic dianhydride, 2,3,5-tricarboxycyclopentylacetic dianhydride, 3,5,6-tricarboxynorbornane-2-acetic dianhydride, 2,3,4,5-tetrahydrofurantetracarboxylic dianhydride, 5-(2,5-dioxotetrahydrofuryl)-3-methyl-3-cyclohexene-1,2-dicarboxylic dianhydride, and bicyclo[2,2,2]-oct-7-ene-2,3,5,6-tetracarboxylic dianhydride; and aromatic-ring-containing aliphatic tetracarboxylic dianhydrides such as 1,3,3a,4,5,9b-hexahydro-2,5-dioxo-3-furanyl)-naphtho[1,2-c]furan-1,3-dione, 1,3,3a,4,5,9b-hexahydro-5-methyl-5-(tetrahydro-2,5-dioxo-3-furanyl)-naphtho[1,2-c]furan-1,3-dione, and 1,3,3a,4,5,9b-hexahydro-8-methyl-5-(tetrahydro-2,5-dioxo-3-furanyl)-naphtho[1,2-c]furan-1,3-dione.

Preferred among these tetracarboxylic dianhydrides are aromatic tetracarboxylic dianhydrides, specific examples thereof including pyromellitic dianhydride, 3,3',4,4'-biphenyltetracarboxylic dianhydride, 2,3,3',4'-biphenyltetracarboxylic dianhydride, 3,3',4,4'-biphenyl ether tetracarboxylic dianhydride, and 3,3',4,4'-benzophenonetetracarboxylic dianhydride, more preferably pyromellitic dianhydride, 3,3',4,4'-biphenyltetracarboxylic dianhydride, and 3,3',4,4'-benzophenonetetracarboxylic dianhydride, particularly preferably 3,3',4,4'-biphenyltetracarboxylic dianhydride.

These tetracarboxylic dianhydrides may be used alone or in combination of two or more.

If a combination of two or more tetracarboxylic dianhydrides is used, a combination of aromatic tetracarboxylic dianhydrides, a combination of aliphatic tetracarboxylic dianhydrides, or a combination of aromatic and aliphatic tetracarboxylic dianhydrides may be used.

The diamine compound is a diamine compound having two amino groups in the molecular structure thereof. The diamine compound may be either an aromatic compound or an aliphatic compound, preferably an aromatic compound. That is, the divalent organic group for B in general formula (I) is preferably an aromatic organic group.

Examples of diamine compounds include aromatic diamines such as p-phenylenediamine, m-phenylenediamine, 4,4'-diaminodiphenylmethane, 4,4'-diaminodiphenylethane, 4,4'-diaminodiphenyl ether, 4,4'-diaminodiphenyl sulfide, 4,4'-diaminodiphenyl sulfone, 1,5-diaminonaphthalene, 3,3-dimethyl-4,4'-diaminobiphenyl, 5-amino-1-(4'-aminophenyl)-1,3,3-trimethylindane, 6-amino-1-(4'-aminophenyl)-1,3,3-trimethylindane, 4,4'-diaminobenzanilide, 3,5-diamino-3'-trifluoromethylbenzanilide, 3,5-diamino-4'-trifluoromethylbenzanilide, 3,4'-diaminodiphenyl ether, 2,7-diaminofluorene, 2,2-bis(4-aminophenyl)hexafluoropropane, 4,4'-methylene-bis(2-chloroaniline), 2,2',5,5'-tetrachloro-4,4'-diaminobiphenyl, 2,2'-dichloro-4,4'-diamino-5,5'-dimethoxybiphenyl, 3,3'-dimethoxy-4,4'-diaminobiphenyl, 4,4'-diamino-2,2'-bis(trifluoromethyl)biphenyl, 2,2-bis[4-(4-aminophenoxy)phenyl]propane, 2,2-bis[4-(4-aminophenoxy)phenyl]hexafluoropropane, 1,4-bis(4-aminophenoxy)benzene, 4,4'-bis(4-aminophenoxy)-biphenyl, 1,3'-bis(4-aminophenoxy)benzene, 9,9-bis(4-aminophenyl)fluorene, 4,4'-(p-phenyleneisopropylidene)bisaniline, 4,4'-(m-phenyleneisopropylidene)bisaniline, 2,2'-bis[4-(4-amino-2-trifluoromethylphenoxy)phenyl]hexafluoropropane, and 4,4'-bis[4-(4-amino-2-trifluoromethyl)phenoxy]-octafluorobiphenyl; aromatic diamines having two amino groups bound to an aromatic ring and a heteroatom other than the nitrogen atoms of the amino groups, such as diaminotetraphenylthiophene; and aliphatic and alicyclic diamines such as 1,1-m-xylylenediamine, 1,3-propanediamine, tetramethylenediamine, pentamethylenediamine, octamethylenediamine, nonamethylenediamine, 4,4-diaminoheptamethylenediamine, 1,4-diaminocyclohexane, isophoronediamine, tetrahydrodicyclopentadienylenediamine, hexahydro-4,7-methanoindanylenedimethylenediamine, tricyclo[6,2,1,0$^{2.7}$]-undecylenedimethyldiamine, and 4,4'-methylenebis (cyclohexylamine).

Preferred among these diamine compounds are aromatic diamine compounds, specific examples thereof including p-phenylenediamine, m-phenylenediamine, 4,4'-diaminodiphenylmethane, 4,4'-diaminodiphenyl ether, 3,4'-diaminodiphenyl ether, 4,4'-diaminodiphenyl sulfide, and 4,4'-diaminodiphenyl sulfone, particularly preferably 4,4'-diaminodiphenyl ether and p-phenylenediamine.

These diamine compounds may be used alone or in combination of two or more. If a combination of two or more diamine compounds is used, a combination of aromatic diamine compounds, a combination of aliphatic diamine compounds, or a combination of aromatic and aliphatic diamine compounds may be used.

The polyimide precursor may have a number average molecular weight of from 1,000 to 150,000, preferably from 5,000 to 130,000, more preferably from 10,000 to 100,000.

If the number average molecular weight of the polyimide precursor falls within the above ranges, the polyimide precursor may exhibit less decrease in solubility in solvents and therefore better film-forming properties.

The number average molecular weight of the polyimide precursor is measured by a gel permeation chromatography (GPC) technique under the following measurement conditions:

Column: Tosoh TSKGEL α-M (7.8 mm I.D.×30 cm)
Eluent: dimethylformamide (DMF)/30 mM LiBr/60 mM phosphoric acid
Flow rate: 0.6 mL/min
Injection volume: 60 μL
Detector: differential refractive index detector (RI)

The amount (concentration) of the polyimide precursor may be from 0.1% by mass to 40% by mass, preferably from 0.5% by mass to 25% by mass, more preferably from 1% by mass to 20% by mass, based on the total mass of the polyimide precursor solution.

Organic Amine Compound

The organic amine compound is a compound that may convert the polyimide precursor (its carboxyl groups) into an amine salt to increase its solubility in aqueous solvents and may also function as an imidization accelerator. Specifically, the organic amine compound may be an amine compound having a molecular weight of 170 or less. The organic amine compound may be a compound other than the diamine compound used as a starting material for the polyimide precursor.

The organic amine compound may be a water-soluble compound. "Water-soluble" means that the substance of interest has a solubility of 1% by mass or more in water at 25° C.

Examples of organic amine compounds include primary amine compounds, secondary amine compounds, and tertiary amine compounds.

Among these organic amine compounds, at least one selected from secondary amine compounds and tertiary amine compounds (particularly tertiary amine compounds) may be used. The use of a secondary or tertiary amine compound (particularly a tertiary amine compound) as the organic amine compound may increase the solubility of the polyimide precursor in solvents, thus improving the film-forming properties, and may also improve the storage stability of the polyimide precursor solution.

Examples of organic amine compounds include monoamine compounds and diamine and polyamine compounds. The use of a diamine or polyamine compound may facilitate formation of a pseudo-crosslinked structure between polyimide precursor molecules and may also improve the storage stability of the polyimide precursor solution.

Examples of primary amine compounds include methylamine, ethylamine, n-propylamine, isopropylamine, 2-ethanolamine, and 2-amino-2-methyl-1-propanol.

Examples of secondary amine compounds include dimethylamine, 2-(methylamino)ethanol, 2-(ethylamino)ethanol, and morpholine.

Examples of tertiary amine compounds include 2-dimethylaminoethanol, 2-diethylaminoethanol, 2-dimethylaminopropanol, pyridine, triethylamine, picoline, N-methylmorpholine, N-ethylmorpholine, 1,2-dimethylimidazole, 2-ethyl-4-methylimidazole, N-methylpiperidine, and N-ethylpiperidine.

Tertiary amine compounds are preferred from the viewpoint of the pot life of the polyimide precursor solution and film thickness uniformity. From this viewpoint, it is more preferred to use at least one selected from the group consisting of 2-dimethylaminoethanol, 2-diethylaminoethanol, 2-dimethylaminopropanol, pyridine, triethylamine, picoline, N-methylmorpholine, N-ethylmorpholine, 1,2-dimethylimidazole, 2-ethyl-4-methylimidazole, N-methylpiperidine, and N-ethylpiperidine.

From the viewpoint of film-forming properties, it is also preferred that the organic amine compound be an aliphatic or aromatic cyclic amine compound having a nitrogen-containing heterocyclic structure (hereinafter referred to as "nitrogen-containing heterocyclic amine compound"). More preferably, the nitrogen-containing heterocyclic amine compound is a tertiary amine compound.

Examples of nitrogen-containing heterocyclic amine compounds include isoquinolines (amine compounds having an isoquinoline skeleton), pyridines (amine compounds having a pyridine skeleton), pyrimidines (amine compounds having a pyrimidine skeleton), pyrazines (amine compounds having a pyrazine skeleton), piperazines (amine compounds having a piperazine skeleton), triazines (amine compounds having a triazine skeleton), imidazoles (amine compounds having an imidazole skeleton), morpholines (amine compounds having a morpholine skeleton), polyaniline, polypyridine, and polyamines.

From the viewpoint of film-forming properties, it is preferred that the nitrogen-containing heterocyclic amine compound be at least one selected from the group consisting of morpholines, pyridines, piperidines, and imidazoles, more preferably at least one selected from the group consisting of N-methylmorpholine, N-methylpiperidine, pyridine, 1,2-dimethylimidazole, 2-ethyl-4-methylimidazole, and picoline.

Among these organic amine compounds, those having a boiling point of 60° C. or higher (preferably from 60° C. to 200° C., more preferably from 70° C. to 150° C.) may be used. If the organic amine compound has a boiling point of 60° C. or higher, less organic amine compound may volatilize from the polyimide precursor solution during storage. This may result in less decrease in the solubility of the polyimide precursor in solvents.

The amount of the organic amine compound may be from 50 mole percent to 500 mole percent, preferably from 80 mole percent to 250 mole percent, more preferably from 90 mole percent to 200 mole percent, based on the number of moles of carboxyl groups (—COOH) in the polyimide precursor in the polyimide precursor solution.

If the amount of the organic amine compound falls within the above ranges, the organic amine compound may increase the solubility of the polyimide precursor in solvents, thus improving the film-forming properties, and may also improve the storage stability of the polyimide precursor solution.

The foregoing organic amine compounds may be used alone or in combination of two or more.

Aqueous Solvent

The aqueous solvent is an aqueous solvent containing water. Specifically, the aqueous solvent may be a solvent containing water in an amount of 50% by mass or more based on the total mass of the aqueous solvent. Examples of water include distilled water, deionized water, ultrafiltered water, and pure water.

The amount of water is from 50% by mass to 100% by mass, more preferably from 70% by mass to 100% by mass, even more preferably from 80% by mass to 100% by mass, based on the total mass of the aqueous solvent.

If the aqueous solvent contains a solvent other than water, the solvent other than water may be, for example, a water-soluble organic solvent. From the viewpoint of the properties, such as transparency and mechanical strength, of the polyimide shaped article, the solvent other than water may be a water-soluble organic solvent. In particular, to improve the various properties, such as transparency, mechanical strength, heat resistance, electrical characteristics, and solvent resistance, of the polyimide shaped article, the aqueous solvent may be free of aprotic polar solvents. If the aqueous solvent contains any aprotic polar solvent, the aqueous solvent may contain a limited amount of aprotic polar solvent (e.g., 40% by mass or less, preferably 30% by mass or less, based on the total mass of the aqueous solvent). As used herein, "water-soluble" means that the substance of interest has a solubility of 1% by mass or more in water at 25° C.

The following water-soluble organic solvents may be used alone or in combination of two or more.

Water-soluble ether-based solvent is a water-soluble solvent having an ether linkage in one molecule. Examples of water-soluble ether-based solvent include tetrahydrofuran (THF), dioxane, trioxane, 1,2-dimethoxyethane, diethylene glycol dimethyl ether, and diethylene glycol diethyl ether. Preferred among these examples of water-soluble ether-based solvent are tetrahydrofuran and dioxane.

Water-soluble ketone-based solvent is a water-soluble solvent having a ketone group in one molecule. Examples of water-soluble ketone-based solvent include acetone, methyl ethyl ketone, and cyclohexanone. Preferred among these examples of water-soluble ketone-based solvent is acetone.

Water-soluble alcohol-based solvent is a water-soluble solvent having an alcoholic hydroxyl group in one molecule. Examples of water-soluble alcohol-based solvent include methanol, ethanol, 1-propanol, 2-propanol, tert-butyl alcohol, ethylene glycol, ethylene glycol monoalkyl ether, propylene glycol, propylene glycol monoalkyl ether, diethylene glycol, diethylene glycol monoalkyl ether, 1,2-propanediol, 1,3-propanediol, 1,3-butanediol, 1,4-butanediol, 2,3-butanediol, 1,5-pentanediol, 2-butene-1,4-diol, 2-methyl-2,4-pentanediol, glycerol, 2-ethyl-2-hydroxymethyl-1,3-propanediol, and 1,2,6-hexanetriol. Preferred among these examples of water-soluble alcohol-based solvent are methanol, ethanol, 2-propanol, ethylene glycol, ethylene glycol monoalkyl ether, propylene glycol, propylene glycol monoalkyl ether, diethylene glycol, and diethylene glycol monoalkyl ether.

If an aprotic polar solvent is used, the aprotic polar solvent used in combination is a solvent having a boiling point of from 150° C. to 300° C. and a dipole moment of from 3.0 D to 5.0 D. Specific examples of aprotic polar solvents include N-methyl-2-pyrrolidone (NMP), N,N-dimethylformamide (DMF), N,N-dimethylacetamide (DMAc), N,N-diethylacetamide (DEAc), dimethyl sulfoxide (DMSO), hexamethylenephosphoramide (HMPA), N-methylcaprolactam, N-acetyl-2-pyrrolidone, N,N-dimethylimidazolidinone (DMI), and 1,3-dimethyl-imidazolidone.

If the aqueous solvent contains a solvent other than water, the solvent used in combination may have a boiling point of 270° C. or lower, preferably from 60° C. to 250° C., more preferably from 80° C. to 230° C. If the boiling point of the solvent used in combination falls within the above ranges, less solvent other than water may remain in the polyimide shaped article, and a polyimide shaped article with higher mechanical strength may be obtained.

How much polyimide precursor dissolves in the solvent is controlled by changing the water content and the type and amount of the organic amine compound. If the water content is low, more polyimide precursor dissolves at low organic amine compound content. Conversely, if the water content is high, more polyimide precursor dissolves at high organic amine compound content. If the organic amine compound is highly hydrophilic, for example, because it has a hydroxyl group, more polyimide precursor dissolves at high water content.

The polyimide precursor may also be a polyimide precursor synthesized in an organic solvent such as an aprotic polar solvent (e.g., N-methylpyrrolidone (NMP)), added to and precipitated from a poor solvent such as water or an alcohol, and separated therefrom.

Other Additives

In the method for manufacturing the porous polyimide shaped article according to the exemplary embodiment, the polyimide precursor solution may contain other additives such as catalysts for accelerating the imidization reaction and leveling agents for improving the film quality.

Examples of catalysts that may be used for accelerating the imidization reaction include dehydrating agents such as acid anhydrides, phenol derivatives, sulfonic acid derivatives, and acid catalysts such as benzoic acid derivatives.

The polyimide precursor solution may also contain, for example, a conductive material (conductive (e.g., having a volume resistivity of less than $10^7$ Ω·cm) or semiconductive (e.g., having a volume resistivity of from $10^7$ Ω·cm to $10^{13}$ Ω·cm)) that is added in order to impart conductivity depending on the intended use of the porous polyimide shaped article.

Examples of conductors include carbon black (e.g., acidic carbon black with a pH of 5.0 or less); metals (e.g., aluminum and nickel); metal oxide (e.g., yttrium oxide and tin oxide); and ionically conductive materials (e.g., potassium titanate and LiCl). These conductive materials may be used alone or in combination of two or more.

The polyimide precursor solution may also contain inorganic particles that are added in order to improve mechanical strength depending on the intended use of the porous polyimide shaped article. Examples of inorganic particles include particulate materials such as silica powder, alumina powder, barium sulfate powder, titanium oxide powder, mica, and talc. Materials used for electrodes for lithium ion batteries, such as $LiCoO_2$ and $LiMn_2O$, may also be used.

Method for Manufacturing Polyimide Precursor Solution

Examples of methods for manufacturing the polyimide precursor solution include, but not limited to, the following methods of manufacture.

An example method includes polymerizing a tetracarboxylic dianhydride and a diamine compound in an aqueous solvent in the presence of an organic amine compound to form a resin (polyimide precursor) and obtain a polyimide precursor solution.

Since this method uses an aqueous solvent, it may offer high productivity and may also require a simpler process because the polyimide precursor solution is manufactured in one step.

Another example method includes polymerizing a tetracarboxylic dianhydride and a diamine compound in an organic solvent such as an aprotic polar solvent (e.g., N-methylpyrrolidone (NMP)) to form a resin (polyimide precursor), introducing it into an aqueous solvent such as water or an alcohol to precipitate the resin (polyimide precursor), and then dissolving the polyimide precursor and an organic amine compound in an aqueous solvent to obtain a polyimide precursor solution.

Although a polyimide precursor solution containing a polyimide precursor and an organic amine compound dissolved in an aqueous solvent has been described by way of example, this need not necessarily be used. For example, a polyimide precursor solution having no organic amine compound dissolved therein may also be used. Specifically, an example method includes polymerizing a tetracarboxylic dianhydride and a diamine compound in a mixture of aqueous solvents selected from water-soluble ether-based solvent, water-soluble ketone-based solvent, water-soluble alcohol-based solvent, and water (e.g., a mixture of water-soluble ether-based solvent and water, a mixture of water-soluble ketone-based solvent and water, or a mixture of water-soluble alcohol-based solvent and water) to form a resin (polyimide precursor) and obtain a polyimide precursor solution.

EXAMPLES

Examples will hereinafter be described, although these examples are not intended to limit the present disclosure in any way. In the following description, all parts and percentages are by mass unless otherwise specified.

Synthesis Example 1

Preparation of PMMA Particle Dispersion-1

A mixture of 670 parts by mass of methyl methacrylate, 25.0 parts by mass of the surfactant DOWFAX 2A1 (47% solution, manufactured by the Dow Chemical Company), and 670 parts by mass of deionized water is prepared. The mixture is emulsified by stirring in a dissolver at 1,500 rpm for 30 minutes to prepare a monomer emulsion. Then, 1.10 parts by mass of DOWFAX 2A1 (47% solution, manufactured by the Dow Chemical Company) and 1,500 parts by mass of deionized water are introduced into a reaction vessel. After heating to 75° C. under a nitrogen stream, 75 parts by mass of the monomer emulsion is added, and a polymerization initiator solution containing 15 parts by mass of ammonium persulfate dissolved in 98 parts by mass of deionized water is then added dropwise over 10 minutes. After the reaction is continued for 50 minutes after addition, the remaining monomer emulsion is added dropwise over 220 minutes. After the reaction is continued for additional 50 minutes, the reaction mixture is cooled to obtain a resin particle dispersion, i.e., PMMA Particle Dispersion-1. The solid concentration is 22.8% by mass. The resin particles have an average particle size of 0.42 μm.

Preparation of Particle-Dispersed Polyimide Precursor Solution (A1)

To 438.6 g (100 g of particles and 338.6 g of water) of PMMA Particle Dispersion-1 (aqueous resin particle dispersion) are added 40.66 g of deionized water, 2.14 g of N-methylpyrrolidone, 0.39 g (0.0004565 mol) of Diamine-1 (KF-8010 manufactured by Shin-Etsu Chemical Co., Ltd., molecular weight=860), 9.82 g (0.0908435 mol) of p-phenylenediamine (molecular weight=108.14), and 26.86 g (0.0913 mol) of 3,3',4,4'-biphenyltetracarboxylic dianhydride (molecular weight=294.22), and they are dispersed by stirring at 20° C. for 10 minutes. Then, 27.7 g (0.2739 mol) of N-methylmorpholine (organic amine compound) is slowly added, followed by dissolution and reaction with stirring at a reaction temperature of 60° C. for 24 hours to obtain Aqueous Particle-Dispersed Polyimide Precursor Solution (A1). The mass ratio of the particles to the total solid content is 0.74. The solid concentration is 25% by mass. Particle-Dispersed Polyimide Precursor Solution (A1) thus obtained is diluted with water, and the particle size distribution is measured by the method described above. The resin particles show a single peak with an average particle size of 0.42 μm, like PMMA Particle Dispersion-1, and are well dispersed. The volume particle size distribution index (GSDv) is calculated to be 1.18 by the method described above.

Of the foregoing conditions, the amount of PMMA Particle Dispersion-1 added is calculated so that the mass ratio of the PMMA particles (solid) to the total solid content of the solution is 0.74. The amount of tetracarboxylic dianhydride added and the amount of diamine added are calculated so that the total amount of tetracarboxylic dianhydride and the total amount of diamine are equimolar. The amount of Diamine-1 added and the amount of p-phenylenediamine added are calculated so that the molar ratio thereof is 0.5:99.5. The amount of N-methylpyrrolidone is calculated so that the amount of N-methylpyrrolidone is 15% by mass based on the solid content of the particle-dispersed polyimide precursor solution. The amount of deionized water added is calculated so that the particle-dispersed polyimide precursor solution has a solid concentration of 25% by mass. The amount of N-methylmorpholine added is calculated so that the amount of N-methylmorpholine is 150 mole percent based on the number of moles of carboxyl groups in the polyimide precursor (polyamic acid) to be produced.

Example 1

The particle-dispersed polyimide precursor solution obtained as described above is applied to a 200 mm wide glass substrate with an applicator so that the thickness after baking is 600 μm. After the coating is dried by blowing air at 80° C. for 1 hour, the film is heated from 80° C. to 400° C. at a heating rate of 2° C./min and is maintained at that temperature for 90 minutes. Thereafter, the film is cooled to room temperature (25° C.) and is immersed in water to obtain Porous Polyimide Shaped Article (PI-1).

Porous Polyimide Shaped Article (PI-1) thus obtained has an average pore size $D_{50}$ of 420 nm.

Example 2

Porous Polyimide Shaped Article (PI-2) is formed as in Example 1 except that the porous polyimide shaped article is formed to have a thickness of 620 μm.

Porous Polyimide Shaped Article (PI-2) thus obtained has an average pore size $D_{50}$ of 420 nm.

Example 3

Porous Polyimide Shaped Article (PI-3) is formed as in Example 1 except that the porous polyimide shaped article is formed to have a thickness of 650 μm.

Porous Polyimide Shaped Article (PI-3) thus obtained has an average pore size $D_{50}$ of 420 nm.

Example 4

Porous Polyimide Shaped Article (PI-4) is formed as in Example 1 except that the porous polyimide shaped article is formed to have a thickness of 750 μm.

Porous Polyimide Shaped Article (PI-4) thus obtained has an average pore size $D_{50}$ of 420 nm.

Example 5

Porous Polyimide Shaped Article (PI-5) is formed as in Example 1 except that the porous polyimide shaped article is formed to have a thickness of 900 μm.

Porous Polyimide Shaped Article (PI-5) thus obtained has an average pore size $D_{50}$ of 420 nm.

Synthesis Example 2

Preparation of PMMA Particle Dispersion-2

A mixture of 670 parts by mass of methyl methacrylate, 31.4 parts by mass of the surfactant DOWFAX 2A1 (47% solution, manufactured by the Dow Chemical Company), and 670 parts by mass of deionized water is prepared. The mixture is emulsified by stirring in a dissolver at 1,500 rpm for 30 minutes to prepare a monomer emulsion. Then, 1.10 parts by mass of DOWFAX 2A1 (47% solution, manufactured by the Dow Chemical Company) and 1,500 parts by mass of deionized water are introduced into a reaction vessel. After heating to 75° C. under a nitrogen stream, 75 parts by mass of the monomer emulsion is added, and a polymerization initiator solution containing 15 parts by mass of ammonium persulfate dissolved in 98 parts by mass of deionized water is then added dropwise over 10 minutes. After the reaction is continued for 50 minutes after addition, the remaining monomer emulsion is added dropwise over 220 minutes. After the reaction is continued for additional 50 minutes, the reaction mixture is cooled to obtain a resin particle dispersion, i.e., PMMA Particle Dispersion-2. The solid concentration is 23.2% by mass. The resin particles have an average particle size of 0.33 μm.

Preparation of Particle-Dispersed Polyimide Precursor Solution (A2)

To 438.6 g (100 g of particles and 338.6 g of water) of PMMA Particle Dispersion-2 (aqueous resin particle dispersion) are added 40.66 g of deionized water, 2.14 g of N-methylpyrrolidone, 0.39 g (0.0004565 mol) of Diamine-1 (KF-8010 manufactured by Shin-Etsu Chemical Co., Ltd., molecular weight=860), 9.82 g (0.0908435 mol) of p-phenylenediamine (molecular weight=108.14), and 26.86 g (0.0913 mol) of 3,3',4,4'-biphenyltetracarboxylic dianhydride (molecular weight=294.22), and they are dispersed by stirring at 20° C. for 10 minutes. Then, 27.7 g (0.2739 mol) of N-methylmorpholine (organic amine compound) is slowly added, followed by dissolution and reaction with stirring at a reaction temperature of 60° C. for 24 hours to obtain Aqueous Particle-Dispersed Polyimide Precursor Solution (A2). The mass ratio of the particles to the total solid content is 0.74. The solid concentration is 24.3% by mass. Particle-Dispersed Polyimide Precursor Solution (A2) thus obtained is diluted with water, and the particle size distribution is measured by the method described above. The resin particles show a single peak with an average particle size of 0.33 μm, like PMMA Particle Dispersion-2, and are well dispersed. The volume particle size distribution index (GSDv) is calculated to be 1.18 by the method described above.

Of the foregoing conditions, the amount of PMMA Particle Dispersion-2 added is calculated so that the mass ratio of the PMMA particles (solid) to the total solid content of the solution is 0.74. The amount of tetracarboxylic dianhydride added and the amount of diamine added are calculated so that the total amount of tetracarboxylic dianhydride and the total amount of diamine are equimolar. The amount of Diamine-1 added and the amount of p-phenylenediamine added are calculated so that the molar ratio thereof is 0.5:99.5. The amount of N-methylpyrrolidone is calculated so that the amount of N-methylpyrrolidone is 15% by mass based on the solid content of the particle-dispersed polyimide precursor solution. The amount of deionized water added is calculated so that the particle-dispersed polyimide precursor solution has a solid concentration of 25% by mass. The amount of N-methylmorpholine added is calculated so that the amount of N-methylmorpholine is 150 mole percent based on the number of moles of carboxyl groups in the polyimide precursor (polyamic acid) to be produced.

Example 6

The particle-dispersed polyimide precursor solution obtained as described above is applied to a 200 mm wide glass substrate with an applicator so that the thickness after baking is 600 μm. After the coating is dried by blowing air at 80° C. for 1 hour, the film is heated from 80° C. to 400° C. at a heating rate of 2° C./min and is maintained at that temperature for 90 minutes. Thereafter, the film is cooled to room temperature (25° C.) and is immersed in water to obtain Porous Polyimide Shaped Article (PI-6).

Porous Polyimide Shaped Article (PI-6) thus obtained has an average pore size $D_{50}$ of 330 nm.

Synthesis Example 3

Preparation of PMMA Particle Dispersion-3

A mixture of 670 parts by mass of methyl methacrylate, 12.4 parts by mass of the surfactant DOWFAX 2A1 (47% solution, manufactured by the Dow Chemical Company), and 670 parts by mass of deionized water is prepared. The mixture is emulsified by stirring in a dissolver at 1,500 rpm for 30 minutes to prepare a monomer emulsion. Then, 1.10 parts by mass of DOWFAX 2A1 (47% solution, manufactured by the Dow Chemical Company) and 1,500 parts by mass of deionized water are introduced into a reaction vessel. After heating to 75° C. under a nitrogen stream, 75 parts by mass of the monomer emulsion is added, and a polymerization initiator solution containing 15 parts by mass of ammonium persulfate dissolved in 98 parts by mass of deionized water is then added dropwise over 10 minutes. After the reaction is continued for 50 minutes after addition, the remaining monomer emulsion is added dropwise over 220 minutes. After the reaction is continued for additional 50 minutes, the reaction mixture is cooled to obtain a resin particle dispersion, i.e., PMMA Particle Dispersion-3. The solid concentration is 18.5% by mass. The resin particles have an average particle size of 0.82 μm.

Preparation of Particle-Dispersed Polyimide Precursor Solution (A3)

To 438.6 g (100 g of particles and 338.6 g of water) of PMMA Particle Dispersion-3 (aqueous resin particle dispersion) are added 40.66 g of deionized water, 2.14 g of N-methylpyrrolidone, 0.39 g (0.0004565 mol) of Diamine-1

(KF-8010 manufactured by Shin-Etsu Chemical Co., Ltd., molecular weight=860), 9.82 g (0.0908435 mol) of p-phenylenediamine (molecular weight=108.14), and 26.86 g (0.0913 mol) of 3,3',4,4'-biphenyltetracarboxylic dianhydride (molecular weight=294.22), and they are dispersed by stirring at 20° C. for 10 minutes. Then, 27.7 g (0.2739 mol) of N-methylmorpholine (organic amine compound) is slowly added, followed by dissolution and reaction with stirring at a reaction temperature of 60° C. for 24 hours to obtain Aqueous Particle-Dispersed Polyimide Precursor Solution (A3). The mass ratio of the particles to the total solid content is 0.74. The solid concentration is 18.5% by mass. Particle-Dispersed Polyimide Precursor Solution (A3) thus obtained is diluted with water, and the particle size distribution is measured by the method described above. The resin particles show a single peak with an average particle size of 0.82 µm, like PMMA Particle Dispersion-3, and are well dispersed. The volume particle size distribution index (GSDv) is calculated to be 1.18 by the method described above.

Of the foregoing conditions, the amount of PMMA Particle Dispersion-3 added is calculated so that the mass ratio of the PMMA particles (solid) to the total solid content of the solution is 0.74. The amount of tetracarboxylic dianhydride added and the amount of diamine added are calculated so that the total amount of tetracarboxylic dianhydride and the total amount of diamine are equimolar. The amount of Diamine-1 added and the amount of p-phenylenediamine added are calculated so that the molar ratio thereof is 0.5:99.5. The amount of N-methylpyrrolidone is calculated so that the amount of N-methylpyrrolidone is 15% by mass based on the solid content of the particle-dispersed polyimide precursor solution. The amount of deionized water added is calculated so that the particle-dispersed polyimide precursor solution has a solid concentration of 25% by mass. The amount of N-methylmorpholine added is calculated so that the amount of N-methylmorpholine is 150 mole percent based on the number of moles of carboxyl groups in the polyimide precursor (polyamic acid) to be produced.

Example 7

The particle-dispersed polyimide precursor solution obtained as described above is applied to a 200 mm wide glass substrate with an applicator so that the thickness after baking is 600 µm. After the coating is dried by blowing air at 80° C. for 1 hour, the film is heated from 80° C. to 400° C. at a heating rate of 2° C./min and is maintained at that temperature for 90 minutes. Thereafter, the film is cooled to room temperature (25° C.) and is immersed in water to obtain Porous Polyimide Shaped Article (PI-7).

Porous Polyimide Shaped Article (PI-7) thus obtained has an average pore size $D_{50}$ of 820 nm.

Comparative Example 1

Preparation of Polyimide Precursor Solution

A flask equipped with a stir bar, a thermometer, and a dropping funnel is charged with 900 g of water. To the flask are added 27.28 g (252.27 mmol) of p-phenylenediamine (molecular weight=108.14) and 50.00 g (494.32 mmol) of methylmorpholine (organic amine compound), and they are dispersed by stirring at 20° C. for 10 minutes. In addition, 72.72 g (247.16 mmol) of 3,3',4,4'-biphenyltetracarboxylic dianhydride (molecular weight=294.22) is added to the solution, followed by dissolution and reaction with stirring at a reaction temperature of 20° C. for 24 hours to obtain a polyimide precursor solution.

Next, 10 parts of an uncrosslinked polymethyl methacrylate-styrene copolymer (FS-102E manufactured by Nippon-paint Co., Ltd.) having an average particle size of 0.2 µm and 1 part of a polyvinyl butyral resin (S-LEC SV-02 manufactured by Sekisui Chemical Co., Ltd.) are added to 30 parts of ethanol, and the mixture is stirred on a web rotor to prepare a dispersion. This dispersion is applied to a glass substrate so that the thickness after drying is 500 µm and is dried at 90° C. for 1 hour to form a resin particle layer.

The polyimide precursor solution prepared as described above is diluted 10 times and is applied to the resin particle layer, followed by vacuum degassing to impregnate the gaps between the resin particles with the polyimide precursor solution. After drying at room temperature (25° C.) overnight, excess polyimide precursor is removed from the resin particle layer by wiping with water so that the surface of the resin particle layer is exposed. After heating at 120° C. for 1 hour, the film is stripped from the glass substrate and is immersed in toluene to dissolve the resin particles. After drying, the film is heated from room temperature to 400° C. at a rate of 10° C./min and is maintained at 400° C. for 1 hour, followed by cooling to room temperature to obtain Porous Polyimide Shaped Article (RPI-1) with a thickness of 500 µm.

Porous Polyimide Shaped Article (RPI-1) thus obtained has an average pore size $D_{50}$ of 360 nm.

Comparative Example 2

One liter of anhydrous N-methyl-2-pyrrolidone (NMP) is placed into a reaction vessel. After 20 g of p-diaminobenzene is dissolved, the solution is cooled to 0° C. To the solution is added 40 g of pyromellitic dianhydride, and it is reacted for 1 hour. After the reaction is continued at room temperature for additional 2 hours, 0.01 g of aniline is added, and the reaction is continued for 30 minutes to obtain a viscous solution. This solution is used to form a film with a thickness of about 1.5 mm on a glass plate. The film is introduced into an NMP solution containing 28% by mass of dicyclohexylcarbodiimide (DCC) to obtain a gel-like film. After the film is immersed in NMP solvent, the film is simultaneously biaxially stretched 2.3 times and is fixed to a frame, followed by drying at 250° C. to obtain a polyimide shaped article. A $CO_2$ light scattering cell is charged with 100 parts by mass of the polyimide shaped article obtained by the method described above and 1.5 parts by mass of N-methylpyrrolidone, and 440,000 parts by mass of carbon dioxide gas is injected to a pressure of 16 MPa. Thereafter, an autoclave containing the $CO_2$ light scattering cell is heated to 250° C., and the film is observed under a digital microscope. At this time, it is found that a film-like polyimide precursor shaped article has been formed in a swelled state. Thereafter, the temperature is decreased at a rate of 200° C./hr to room temperature and pressure to obtain Porous Polyimide Shaped Article (RPI-2) with a thickness of 500 µm.

Porous Polyimide Shaped Article (RPI-2) thus obtained has an average pore size $D_{50}$ of 620 nm.

Comparative Example 3

Porous Polyimide Shaped Article (RPI-3) is formed as in Comparative Example 2 except that the porous polyimide shaped article is formed to have a thickness of 600 µm.

Porous Polyimide Shaped Article (RPI-3) thus obtained has an average pore size $D_{50}$ of 620 nm.

Thickness

The thickness of the porous polyimide shaped article obtained in each example is measured by the method described above.

Pore Size Distribution Index Measurement

The pore size distribution index of the porous polyimide shaped article obtained in each example is measured by the method described above.

Relative Dielectric Constant and Dielectric Loss Tangent at 1 MHz

The relative dielectric constant and dielectric loss tangent at 1 MHz of the porous polyimide shaped article obtained in each example are measured by the method described above.

Tensile Strength

The tensile strength of the porous polyimide shaped article obtained in each example is measured by the method described above.

Void Size Evaluation

The void size (the percentage of voids having a ratio of major axis/minor axis of more than 1.5) of the porous polyimide shaped article obtained in each example is evaluated by the method described above.

Analysis of Organic Amine and Resin Other than Polyimide

The gas components produced from the porous polyimide shaped article obtained in each example are analyzed by pyrolysis-gas chromatography-mass spectrometry (hereinafter GC-MS) by the method described above.

is subjected to through-hole processing at a diameter of 75 μm and is plated to form a copper foil layer with a thickness of 12 μm. Thereafter, a film resist manufactured by Tokyo Ohka Kogyo Co., Ltd. (HR-130) is laminated on the copper foil at 100° C. and 3 kg/cm². A mask corresponding to a single-end microstrip line (MSL) (line length (L)=5 cm, line width (W)=100 μm) is mounted, and the resist film on the copper foil on one side is exposed with an ultrahigh-pressure mercury lamp at 30 mJ/cm² and is then developed by spraying with a 0.5% aqueous $Na_2CO_3$ solution to form a mask.

Next, the mask surface is sprayed with an $FeCl_3$/HCl etchant manufactured by Wako Pure Chemical Corporation to etch the copper foil. The wiring board is then washed with running water for 1 minute, immersed in dilute HCl for 2 minutes, and further washed with running water for 1 minute. Thereafter, the wiring board is immersed in a 2% aqueous NaOH solution to strip the resist film and is then washed with running water for 2 minutes and dried at 120° C. for 60 minutes to obtain a sample for transmission loss measurement.

The sample for transmission loss measurement based on the porous substrate is subjected to TDR evaluation with a DSA8200 digital sampling oscilloscope manufactured by Tektronix, Inc. and a 80E04 TDR module manufactured by Tektronix, Inc. The characteristic impedance is found to be within 50±0.5Ω.

For transmission loss evaluation, the substrate is connected to a 8722D vector network analyzer manufactured by

TABLE 1

| | No. | Thickness (μm) | Pore Size Distribution Index | Relative dielectric constant (at 1 MHz) | Dielectric loss tangent (at 1 MHz) | Tensile strength (MPa) | Percentage of voids having major-to-minor axis ratio (major axis/minor axis) of more than 1.5 (%) | Amount of organic amine compound (% by mass) | Amount of monomer component derived from resin other than polyimide resin (% by mass) |
|---|---|---|---|---|---|---|---|---|---|
| Example 1 | PI-1 | 600 | 1.38 | 1.75 | 0.0095 | 62 | 4 | 0.0054 | 0.0081 |
| Example 2 | PI-2 | 620 | 1.42 | 1.72 | 0.0088 | 64 | 3.8 | 0.0056 | 0.0083 |
| Example 3 | PI-3 | 650 | 1.44 | 1.68 | 0.0075 | 68 | 3.8 | 0.0058 | 0.0086 |
| Example 4 | PI-4 | 750 | 1.46 | 1.58 | 0.0068 | 71 | 3.5 | 0.0061 | 0.0092 |
| Example 5 | PI-5 | 900 | 1.47 | 1.47 | 0.0056 | 75 | 3.2 | 0.0065 | 0.011 |
| Example 6 | PI-6 | 600 | 1.45 | 1.79 | 0.0097 | 65 | 4.5 | 0.0034 | 0.0063 |
| Example 7 | PI-7 | 600 | 1.41 | 1.53 | 0.0071 | 60 | 6 | 0.0041 | 0.0068 |
| Comparative Example 1 | RPI-1 | 500 | 1.83 | 1.81 | 0.012 | 42 | 15 | 0.0043 | 0.0058 |
| Comparative Example 2 | RPI-2 | 500 | 1.98 | 1.95 | 0.028 | 22 | 25 | 0 | 0 |
| Comparative Example 3 | RPI-3 | 600 | 1.92 | 1.91 | 0.021 | 24 | 20 | 0 | 0 |

The foregoing results show that the Examples exhibit improved tensile strengths and sharp pore size distributions as compared to the Comparative Examples and that the Examples exhibit reduced in-plane variation in relative dielectric constant because of their sharp pore size distributions.

Next, the application of a porous polyimide shaped article to a circuit board is evaluated.

A porous substrate including a porous polyimide shaped article with a thickness of 600 μm on a copper foil is prepared and evaluated for transmission loss through a transmission line when used as a radio-frequency circuit board. A copper foil layer with a thickness of 8 μm is formed by copper sputtering and electroplating to prepare a copper clad laminate having a copper foil on each side. The resulting copper clad laminate having a copper foil on each side Agilent Technologies, Inc. via a 50Ω coaxial cable using an ACP40-GSG125 probe manufactured by Cascade Microtech, Inc., with the probe end connected to a terminal portion of the MSL. The transmission loss is measured as S-parameters (S21) for MSLs with different line lengths. To calculate the amount of loss (dB/cm) through a transmission line at 10 GHz and 40 GHz, the effect of the terminal portion of the MSL on transmission loss is eliminated (measurement for line length of 5 cm–measurement for line length of 3 cm), and the amount of loss per unit length (dB/cm) is calculated from the remainder.

By reducing the in-plane variation in relative dielectric constant, the amount of loss per unit length at 10 GHz is reduced to within −0.50 [dB/cm]. This demonstrates that, since the conductor loss is reduced, the transmission loss is reduced, and better transmission characteristics are achieved.

The evaluation results show that the Examples may be suitable for use as circuit boards.

The foregoing description of the exemplary embodiment of the present disclosure has been provided for the purposes of illustration and description. It is not intended to be exhaustive or to limit the disclosure to the precise forms disclosed. Obviously, many modifications and variations will be apparent to practitioners skilled in the art. The embodiment was chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A porous polyimide shaped article comprising:
the porous polyimide shaped article having a thickness in a range from 550 μm to 3,000 μm and having a relative dielectric constant of 1.8 or less and a dielectric loss tangent of 0.01 or less at 1 MHz, the porous polyimide shaped article satisfying the following formula:

$1.2 \leq A \leq 1.6$ wherein A represents a square root of a ratio of a pore size $D_{84}$ to a pore size $D_{16}$ $((D_{84}/D_{16})^{1/2})$, and $D_{16}$ and $D_{84}$ respectively represent pore diameters at 16% and 84% points on an accumulation curve of a pore size distribution measured by mercury intrusion porosimetry when a total number of pores in the porous polyimide shaped article is 100%,
wherein the porous polyimide shaped article contains spherical voids, wherein a percentage of voids having a ratio of a major axis to a minor axis (major axis/minor axis) of more than 1.5 is 20% or less.

2. The porous polyimide shaped article according to claim 1, wherein the percentage of the voids having a (major axis/minor axis) of more than 1.5 is less than 10%.

3. The porous polyimide shaped article according to claim 1, wherein the porous polyimide shaped article contains an organic amine compound.

4. The porous polyimide shaped article according to claim 3, wherein the organic amine compound is a tertiary amine compound.

5. The porous polyimide shaped article according to claim 4, wherein the organic amine compound is at least one compound selected from the group consisting of 2-dimethylaminoethanol, 2-diethylaminoethanol, 2-dimethylaminopropanol, pyridine, triethyl amine, picoline, N-methylmorpholine, N-ethylmorpholine, 1,2-dimethylimidazole, 2-ethyl-4-methylimidazole, N-methylpiperidine, and N-ethylpiperidine.

6. The porous polyimide shaped article according to claim 3, wherein the amount of the organic amine compound is in a range from 0.001% by mass to 1.0% by mass based on a total mass of the porous polyimide shaped article.

7. The porous polyimide shaped article according to claim 1, wherein the porous polyimide shaped article contains a resin other than polyimide resin.

8. The porous polyimide shaped article according to claim 7, wherein the amount of the resin other than polyimide resin is in a range from 0.005% by mass to 1.0% by mass based on a total mass of the porous polyimide shaped article.

9. The porous polyimide shaped article according to claim 1, wherein the porous polyimide shaped article is a shaped article for a circuit board.

* * * * *